(12) United States Patent
Fujii et al.

(10) Patent No.: US 9,553,023 B2
(45) Date of Patent: *Jan. 24, 2017

(54) SUBSTRATE DIVIDING METHOD

(71) Applicant: HAMAMATSU PHOTONICS K.K., Hamamatsu-shi, Shizuoka (JP)

(72) Inventors: Yoshimaro Fujii, Hamamatsu (JP); Fumitsugu Fukuyo, Hamamatsu (JP); Kenshi Fukumitsu, Hamamatsu (JP); Naoki Uchiyama, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/226,284

(22) Filed: Aug. 2, 2016

(65) Prior Publication Data

US 2016/0343617 A1    Nov. 24, 2016

Related U.S. Application Data

(63) Continuation of application No. 14/984,066, filed on Dec. 30, 2015, which is a continuation of application (Continued)

(30) Foreign Application Priority Data

Mar. 12, 2002 (JP) .................. 2002-67289

(51) Int. Cl.
  *H01L 21/00* (2006.01)
  *H01L 21/78* (2006.01)
  (Continued)

(52) U.S. Cl.
  CPC ............ *H01L 21/78* (2013.01); *H01L 21/304* (2013.01); *H01L 21/30604* (2013.01)

(58) Field of Classification Search
  CPC ............... H01L 21/76894; H01L 2924/40404; H01L 2924/12042
  See application file for complete search history.

(56) References Cited

U.S. PATENT DOCUMENTS

3,448,510 A    6/1969  Bippus et al.
3,543,979 A    12/1970 Grove et al.
(Continued)

FOREIGN PATENT DOCUMENTS

CN    87106576 A    5/1988
CN    1137430 A    12/1996
(Continued)

OTHER PUBLICATIONS

X. Liu et al., "Laser Ablation and Micromachining with Ultrashort Laser Pulses," IEEE Journal of Quantum Electronics, vol. 33, No. 10, Oct. 1997, pp. 1706-1716.
(Continued)

*Primary Examiner* — Elias M Ullah
(74) *Attorney, Agent, or Firm* — Drinker Biddle & Reath LLP

(57) ABSTRACT

A substrate dividing method which can thin and divide a substrate while preventing chipping, and cracking from occurring. This substrate dividing method comprises the steps of irradiating a semiconductor substrate 1 having a front face 3 formed with functional devices 19 with laser light while positioning a light-converging point within the substrate, so as to form a modified region including a molten processed region due to multiphoton absorption within the semiconductor substrate 1, and causing the modified region including the molten processed region to form a starting point region for cutting; and grinding a rear face 21 of the semiconductor substrate 1 after the step of forming the
(Continued)

starting point region for cutting such that the semiconductor substrate 1 attains a predetermined thickness.

20 Claims, 21 Drawing Sheets

Related U.S. Application Data

No. 14/793,181, filed on Jul. 7, 2015, now Pat. No. 9,287,177, which is a continuation of application No. 14/517,552, filed on Oct. 17, 2014, now Pat. No. 9,142,458, which is a continuation of application No. 13/953,443, filed on Jul. 29, 2013, now Pat. No. 8,889,525, which is a continuation of application No. 13/618,699, filed on Sep. 14, 2012, now Pat. No. 8,519,511, which is a continuation of application No. 10/507,321, filed as application No. PCT/JP03/02669 on Mar. 6, 2003, now Pat. No. 8,268,704.

(51) Int. Cl.
*H01L 21/304* (2006.01)
*H01L 21/306* (2006.01)

(56) References Cited

U.S. PATENT DOCUMENTS

| | | |
|---|---|---|
| 3,610,871 A | 10/1971 | Lumley |
| 3,613,974 A | 10/1971 | Chatelain et al. |
| 3,626,141 A | 12/1971 | Daly |
| 3,629,545 A | 12/1971 | Graham et al. |
| 3,790,051 A | 2/1974 | Moore |
| 3,790,744 A | 2/1974 | Bowen |
| 3,800,991 A | 4/1974 | Grove et al. |
| 3,824,678 A | 7/1974 | Harris et al. |
| 3,909,582 A | 9/1975 | Bowen |
| 3,932,726 A | 1/1976 | Verheyen et al. |
| 3,970,819 A | 7/1976 | Gates et al. |
| 3,991,296 A | 11/1976 | Kojima et al. |
| 4,027,137 A | 5/1977 | Liedtke |
| 4,046,985 A | 9/1977 | Gates |
| 4,092,518 A | 5/1978 | Merard |
| 4,190,759 A | 2/1980 | Hongo et al. |
| 4,224,101 A | 9/1980 | Tijburg et al. |
| 4,242,152 A | 12/1980 | Stone |
| 4,306,351 A | 12/1981 | Ohsaka et al. |
| 4,336,439 A | 6/1982 | Sasnett et al. |
| 4,392,476 A | 7/1983 | Gresser et al. |
| 4,403,134 A | 9/1983 | Klingel |
| 4,475,027 A | 10/1984 | Pressley |
| 4,531,060 A | 7/1985 | Suwa et al. |
| 4,543,464 A | 9/1985 | Takeuchi |
| 4,546,231 A | 10/1985 | Gresser et al. |
| 4,562,333 A | 12/1985 | Taub et al. |
| 4,650,619 A | 3/1987 | Watanabe |
| 4,682,003 A | 7/1987 | Minakawa et al. |
| 4,689,491 A | 8/1987 | Lindow et al. |
| 4,722,130 A | 2/1988 | Kimura et al. |
| 4,734,550 A | 3/1988 | Imamura et al. |
| 4,769,310 A | 9/1988 | Gugger et al. |
| 4,775,967 A | 10/1988 | Shimada et al. |
| 4,814,575 A | 3/1989 | Petitbon |
| 4,815,854 A | 3/1989 | Tanaka et al. |
| 4,899,126 A | 2/1990 | Yamada |
| 4,908,493 A | 3/1990 | Susemihl |
| 4,914,815 A | 4/1990 | Takada et al. |
| 4,942,284 A | 7/1990 | Etcheparre et al. |
| 4,981,525 A | 1/1991 | Kiyama et al. |
| 4,982,166 A | 1/1991 | Morrow |
| 5,023,877 A | 6/1991 | Eden et al. |
| 5,096,449 A | 3/1992 | Matsuzaki |
| 5,122,481 A | 6/1992 | Nishiguchi |
| 5,124,927 A | 6/1992 | Hopewell et al. |
| 5,132,505 A | 7/1992 | Zonneveld et al. |
| 5,151,135 A | 9/1992 | Magee et al. |
| 5,211,805 A | 5/1993 | Srinivasan |
| 5,230,184 A | 7/1993 | Bukhman |
| 5,251,003 A | 10/1993 | Vigouroux et al. |
| 5,254,149 A | 10/1993 | Hashemi et al. |
| 5,254,833 A | 10/1993 | Okiyama |
| 5,293,389 A | 3/1994 | Yano et al. |
| 5,298,719 A | 3/1994 | Shafir |
| 5,300,942 A | 4/1994 | Dolgoff |
| 5,304,357 A | 4/1994 | Sato et al. |
| 5,321,717 A | 6/1994 | Adachi et al. |
| 5,359,176 A | 10/1994 | Balliet, Jr. et al. |
| 5,376,793 A | 12/1994 | Lesniak |
| 5,382,770 A | 1/1995 | Black et al. |
| 5,424,548 A | 6/1995 | Puisto |
| 5,504,772 A | 4/1996 | Deacon et al. |
| 5,508,489 A | 4/1996 | Benda et al. |
| 5,521,999 A | 5/1996 | Chuang et al. |
| 5,534,102 A | 7/1996 | Kadono et al. |
| 5,543,365 A | 8/1996 | Wills et al. |
| 5,575,936 A | 11/1996 | Goldfarb |
| 5,580,473 A | 12/1996 | Shinohara et al. |
| 5,609,284 A | 3/1997 | Kondratenko |
| 5,622,540 A | 4/1997 | Stevens |
| 5,635,976 A | 6/1997 | Thuren et al. |
| 5,637,244 A | 6/1997 | Erokhin |
| 5,641,416 A | 6/1997 | Chadha |
| 5,656,186 A | 8/1997 | Mourou et al. |
| 5,663,980 A | 9/1997 | Adachi |
| 5,736,709 A | 4/1998 | Neiheisel |
| 5,747,769 A | 5/1998 | Rockstroh et al. |
| 5,767,483 A | 6/1998 | Cameron et al. |
| 5,774,222 A | 6/1998 | Maeda et al. |
| 5,776,220 A | 7/1998 | Allaire et al. |
| 5,786,560 A | 7/1998 | Tatah et al. |
| 5,795,795 A | 8/1998 | Kousai et al. |
| 5,807,380 A | 9/1998 | Dishler |
| 5,814,532 A | 9/1998 | Ichihara |
| 5,826,772 A | 10/1998 | Ariglio et al. |
| 5,841,543 A | 11/1998 | Guldi et al. |
| 5,867,324 A | 2/1999 | Kmetec et al. |
| 5,870,133 A | 2/1999 | Naiki |
| 5,882,956 A | 3/1999 | Umehara et al. |
| 5,886,319 A | 3/1999 | Preston et al. |
| 5,900,582 A | 5/1999 | Tomita et al. |
| 5,916,460 A | 6/1999 | Imoto et al. |
| 5,922,224 A | 7/1999 | Broekroelofs |
| 5,925,024 A | 7/1999 | Joffe |
| 5,925,271 A | 7/1999 | Pollack et al. |
| 5,968,382 A | 10/1999 | Matsumoto et al. |
| 5,976,392 A | 11/1999 | Chen |
| 5,998,238 A | 12/1999 | Kosaki |
| 6,023,039 A | 2/2000 | Sawada |
| 6,031,201 A | 2/2000 | Amako et al. |
| 6,055,829 A | 5/2000 | Witzmann et al. |
| 6,057,525 A | 5/2000 | Chang et al. |
| 6,081,330 A | 6/2000 | Nelson et al. |
| 6,087,617 A | 7/2000 | Troitski et al. |
| 6,121,118 A | 9/2000 | Jin et al. |
| 6,127,005 A | 10/2000 | Lehman et al. |
| 6,129,921 A | 10/2000 | Hooper et al. |
| 6,133,986 A | 10/2000 | Johnson |
| 6,141,096 A | 10/2000 | Stern et al. |
| 6,156,030 A | 12/2000 | Neev |
| 6,172,329 B1 | 1/2001 | Shoemaker et al. |
| 6,172,757 B1 | 1/2001 | Lee |
| 6,175,096 B1 | 1/2001 | Nielsen |
| 6,181,728 B1 | 1/2001 | Cordingley et al. |
| 6,183,092 B1 | 2/2001 | Troyer |
| 6,187,088 B1 | 2/2001 | Okumura |
| 6,211,488 B1 | 4/2001 | Hoekstra et al. |
| 6,228,114 B1 | 5/2001 | Lee |
| 6,229,114 B1 | 5/2001 | Andrews et al. |
| 6,236,446 B1 | 5/2001 | Izumi et al. |
| 6,252,197 B1 | 6/2001 | Hoekstra et al. |
| 6,257,224 B1 | 7/2001 | Yoshino et al. |
| 6,259,058 B1 | 7/2001 | Hoekstra |
| 6,259,511 B1 | 7/2001 | Makinouchi et al. |
| 6,277,067 B1 | 8/2001 | Blair |

(56) References Cited

U.S. PATENT DOCUMENTS

| | | |
|---|---|---|
| 6,285,002 B1 | 9/2001 | Ngoi et al. |
| 6,294,439 B1 | 9/2001 | Sasaki et al. |
| 6,320,641 B1 | 11/2001 | Bauer et al. |
| 6,322,958 B1 | 11/2001 | Hayashi |
| 6,325,855 B1 | 12/2001 | Sillmon et al. |
| 6,327,090 B1 | 12/2001 | Rando et al. |
| 6,333,486 B1 | 12/2001 | Troitski |
| 6,344,402 B1 | 2/2002 | Sekiya |
| 6,376,797 B1 | 4/2002 | Piwczyk et al. |
| 6,399,914 B1 | 6/2002 | Troitski |
| 6,402,004 B1 | 6/2002 | Yoshikuni et al. |
| 6,407,363 B2 | 6/2002 | Dunsky et al. |
| RE37,809 E | 7/2002 | Deacon et al. |
| 6,413,839 B1 | 7/2002 | Brown et al. |
| 6,420,678 B1 | 7/2002 | Hoekstra |
| 6,438,996 B1 | 8/2002 | Cuvelier |
| 6,489,588 B1 | 12/2002 | Hoekstra et al. |
| 6,527,965 B1 | 3/2003 | Gee et al. |
| 6,529,362 B2 | 3/2003 | Herchen |
| 6,555,781 B2 | 4/2003 | Ngoi et al. |
| 6,562,698 B2 | 5/2003 | Manor |
| 6,566,683 B1 | 5/2003 | Ogawa et al. |
| 6,608,370 B1 | 8/2003 | Chen et al. |
| 6,612,035 B2 | 9/2003 | Brown et al. |
| 6,613,610 B2 | 9/2003 | Iwafuchi et al. |
| 6,641,662 B2 | 11/2003 | Radojevic et al. |
| 6,653,210 B2 | 11/2003 | Choo et al. |
| 6,657,260 B2 | 12/2003 | Yamazaki et al. |
| 6,660,963 B2 | 12/2003 | Hoekstra et al. |
| 6,726,631 B2 | 4/2004 | Hatangadi et al. |
| 6,744,009 B1 | 6/2004 | Xuan et al. |
| 6,770,544 B2 | 8/2004 | Sawada |
| 6,787,732 B1 | 9/2004 | Xuan et al. |
| 6,902,990 B2 | 6/2005 | Gottfried et al. |
| 6,908,784 B1 | 6/2005 | Farnworth et al. |
| 6,951,799 B2 | 10/2005 | Roche |
| 6,992,026 B2 | 1/2006 | Fukuyo et al. |
| 7,174,620 B2 | 2/2007 | Chiba et al. |
| 7,396,742 B2 | 7/2008 | Fukuyo et al. |
| 7,489,454 B2 | 2/2009 | Fukuyo et al. |
| 7,547,613 B2 | 6/2009 | Fukuyo et al. |
| 7,566,635 B2 | 7/2009 | Fujii et al. |
| 7,592,237 B2 | 9/2009 | Sakamoto et al. |
| 7,592,238 B2 | 9/2009 | Fukuyo et al. |
| 7,605,344 B2 | 10/2009 | Fukumitsu |
| 7,608,214 B2 | 10/2009 | Kuno et al. |
| 7,615,721 B2 | 11/2009 | Fukuyo et al. |
| 7,626,137 B2 | 12/2009 | Fukuyo et al. |
| 7,682,858 B2 | 3/2010 | Nagai et al. |
| 7,709,767 B2 | 5/2010 | Sakamoto |
| 7,718,510 B2 | 5/2010 | Sakamoto et al. |
| 7,719,017 B2 | 5/2010 | Tanaka |
| 7,732,730 B2 | 6/2010 | Fukuyo et al. |
| 7,749,867 B2 | 7/2010 | Fukuyo et al. |
| 7,754,583 B2 | 7/2010 | Sakamoto |
| 7,825,350 B2 | 11/2010 | Fukuyo et al. |
| 7,897,487 B2 | 3/2011 | Sugiura et al. |
| 7,902,636 B2 | 3/2011 | Sugiura et al. |
| 7,939,430 B2 | 5/2011 | Sakamoto et al. |
| 7,947,574 B2 | 5/2011 | Sakamoto et al. |
| 7,989,320 B2 | 8/2011 | Boyle et al. |
| 8,058,103 B2 | 11/2011 | Fukumitsu et al. |
| 8,183,131 B2 | 5/2012 | Fukuyo et al. |
| 8,227,724 B2 | 7/2012 | Fukuyo et al. |
| 8,247,734 B2 | 8/2012 | Fukuyo et al. |
| 8,263,479 B2 | 9/2012 | Fukuyo et al. |
| 8,268,704 B2 | 9/2012 | Fujii et al. |
| 8,283,595 B2 | 10/2012 | Fukuyo et al. |
| 8,304,325 B2 | 11/2012 | Fujii et al. |
| 8,314,013 B2 | 11/2012 | Fujii et al. |
| 8,523,636 B2 | 9/2013 | Uchiyama |
| 8,624,153 B2 | 1/2014 | Atsumi et al. |
| 8,685,838 B2 | 4/2014 | Fukuyo et al. |
| 8,828,306 B2 | 9/2014 | Uchiyama |
| 8,841,580 B2 | 9/2014 | Fukumitsu et al. |
| 8,852,698 B2 | 10/2014 | Fukumitsu |
| 8,927,900 B2 | 1/2015 | Fukuyo et al. |
| 2001/0019361 A1 | 9/2001 | Savoye |
| 2001/0028390 A1 | 10/2001 | Hayashi |
| 2001/0035401 A1 | 11/2001 | Manor |
| 2002/0005805 A1 | 1/2002 | Ogura et al. |
| 2002/0006765 A1 | 1/2002 | Michel et al. |
| 2002/0023903 A1 | 2/2002 | Ann Ngoi et al. |
| 2002/0023907 A1 | 2/2002 | Morishige |
| 2002/0025432 A1 | 2/2002 | Noguchi et al. |
| 2002/0050489 A1 | 5/2002 | Ikegami et al. |
| 2002/0115235 A1 | 8/2002 | Sawada |
| 2002/0125232 A1 | 9/2002 | Choo et al. |
| 2002/0130367 A1 | 9/2002 | Cabral et al. |
| 2002/0139769 A1 | 10/2002 | Helvajian et al. |
| 2002/0170896 A1 | 11/2002 | Choo et al. |
| 2002/0170898 A1 | 11/2002 | Ehrmann et al. |
| 2003/0215973 A1 | 11/2003 | Yamazaki et al. |
| 2004/0002199 A1 | 1/2004 | Fukuyo et al. |
| 2004/0245659 A1 | 12/2004 | Glenn et al. |
| 2005/0173387 A1 | 8/2005 | Fukuyo et al. |
| 2005/0181581 A1 | 8/2005 | Fukuyo et al. |
| 2005/0184037 A1 | 8/2005 | Fukuyo et al. |
| 2005/0189330 A1 | 9/2005 | Fukuyo et al. |
| 2005/0194364 A1 | 9/2005 | Fukuyo et al. |
| 2005/0202596 A1 | 9/2005 | Fukuyo et al. |
| 2005/0272223 A1 | 12/2005 | Fujii et al. |
| 2006/0011593 A1 | 1/2006 | Fukuyo et al. |
| 2006/0040473 A1 | 2/2006 | Fukuyo et al. |
| 2006/0121697 A1 | 6/2006 | Fujii et al. |
| 2006/0144828 A1 | 7/2006 | Fukumitsu et al. |
| 2006/0160331 A1 | 7/2006 | Fukuyo et al. |
| 2007/0085099 A1 | 4/2007 | Fukumitsu et al. |
| 2007/0158314 A1 | 7/2007 | Fukumitsu et al. |
| 2007/0252154 A1 | 11/2007 | Uchiyama et al. |
| 2008/0035611 A1 | 2/2008 | Kuno et al. |
| 2008/0037003 A1 | 2/2008 | Atsumi et al. |
| 2008/0251506 A1 | 10/2008 | Atsumi et al. |
| 2009/0008373 A1 | 1/2009 | Muramatsu et al. |
| 2009/0032509 A1 | 2/2009 | Kuno et al. |
| 2009/0098713 A1 | 4/2009 | Sakamoto |
| 2009/0107967 A1 | 4/2009 | Sakamoto et al. |
| 2009/0117712 A1 | 5/2009 | Sakamoto et al. |
| 2009/0166342 A1 | 7/2009 | Kuno et al. |
| 2009/0166808 A1 | 7/2009 | Sakamoto et al. |
| 2009/0250446 A1 | 10/2009 | Sakamoto |
| 2009/0261083 A1 | 10/2009 | Osajima et al. |
| 2009/0302428 A1 | 12/2009 | Sakamoto et al. |
| 2010/0006548 A1 | 1/2010 | Atsumi et al. |
| 2010/0009547 A1 | 1/2010 | Sakamoto |
| 2010/0012632 A1 | 1/2010 | Sakamoto |
| 2010/0012633 A1 | 1/2010 | Atsumi et al. |
| 2010/0025386 A1 | 2/2010 | Kuno et al. |
| 2010/0032418 A1 | 2/2010 | Kuno et al. |
| 2010/0184271 A1 | 7/2010 | Sugiura et al. |
| 2010/0200550 A1 | 8/2010 | Kumagai |
| 2010/0227453 A1 | 9/2010 | Sakamoto |
| 2010/0240159 A1 | 9/2010 | Kumagai et al. |
| 2010/0258539 A1 | 10/2010 | Sakamoto |
| 2010/0327416 A1 | 12/2010 | Fukumitsu |
| 2011/0000897 A1 | 1/2011 | Nakano et al. |
| 2011/0001220 A1 | 1/2011 | Sugiura et al. |
| 2011/0021004 A1 | 1/2011 | Fukuyo et al. |
| 2011/0027972 A1 | 2/2011 | Fukuyo et al. |
| 2011/0037149 A1 | 2/2011 | Fukuyo et al. |

FOREIGN PATENT DOCUMENTS

| | | |
|---|---|---|
| CN | 1142743 A | 2/1997 |
| CN | 1159378 A | 9/1997 |
| CN | 1160228 A | 9/1997 |
| CN | 1205663 A | 1/1999 |
| CN | 1225502 A | 8/1999 |
| DE | 4331262 A1 | 3/1995 |
| DE | 19728766 C1 | 7/1997 |
| DE | 196 46 332 A1 | 5/1998 |
| EP | 0 213 546 A2 | 3/1987 |
| EP | 0345752 A2 | 12/1989 |
| EP | 0437676 A1 | 7/1991 |

(56) References Cited

FOREIGN PATENT DOCUMENTS

| | | |
|---|---|---|
| EP | 0 863 231 A1 | 9/1998 |
| EP | 0 981 156 A2 | 2/2000 |
| EP | 1 022 778 A1 | 7/2000 |
| EP | 1 026 735 A2 | 8/2000 |
| EP | 1 138 516 A2 | 10/2001 |
| EP | 1 498 216 A1 | 1/2005 |
| EP | 1 580 800 A1 | 9/2005 |
| GB | 2 322 006 A | 8/1998 |
| JP | 46-24989 | 7/1971 |
| JP | 48-12599 | 2/1973 |
| JP | 53-033050 A | 3/1978 |
| JP | 53-141573 A | 12/1978 |
| JP | S54-161349 A | 12/1979 |
| JP | 56-076522 A | 6/1981 |
| JP | 56-28630 | 7/1981 |
| JP | 56-128691 A | 10/1981 |
| JP | 58-036939 A | 3/1983 |
| JP | 58-057767 A | 4/1983 |
| JP | 58-171783 A | 10/1983 |
| JP | 58-181492 A | 10/1983 |
| JP | 59-76687 | 5/1984 |
| JP | 59-130438 A | 7/1984 |
| JP | 59-141233 A | 8/1984 |
| JP | 59-150691 A | 8/1984 |
| JP | 60-055640 A | 3/1985 |
| JP | 60-144985 A | 7/1985 |
| JP | 60-167351 A | 8/1985 |
| JP | 61-096439 A | 5/1986 |
| JP | 61-112345 A | 5/1986 |
| JP | 61-121453 A | 6/1986 |
| JP | 61-220339 A | 9/1986 |
| JP | 62-004341 A | 1/1987 |
| JP | 62-098684 A | 5/1987 |
| JP | S62-296580 A | 12/1987 |
| JP | 63-215390 A | 9/1988 |
| JP | 63-278692 A | 11/1988 |
| JP | S63-293939 A | 11/1988 |
| JP | 64-038209 | 2/1989 |
| JP | 01-112130 A | 4/1989 |
| JP | 01-225509 A | 9/1989 |
| JP | 01-225510 A | 9/1989 |
| JP | 03-124486 A | 5/1991 |
| JP | H03-177051 A | 8/1991 |
| JP | 03-234043 A | 10/1991 |
| JP | 03-276662 A | 12/1991 |
| JP | 03-281073 A | 12/1991 |
| JP | 04-029352 A | 1/1992 |
| JP | 04-111800 A | 4/1992 |
| JP | H04-143645 A | 5/1992 |
| JP | 04-167985 A | 6/1992 |
| JP | 04-188847 A | 7/1992 |
| JP | 04-300084 A | 10/1992 |
| JP | 04-339586 A | 11/1992 |
| JP | 04-356942 A | 12/1992 |
| JP | H05-194080 A | 8/1993 |
| JP | 05-335726 A | 12/1993 |
| JP | 06-039572 A | 2/1994 |
| JP | 06-188310 A | 7/1994 |
| JP | 06-198475 A | 7/1994 |
| JP | 07-029855 A | 1/1995 |
| JP | 07-037840 A | 2/1995 |
| JP | 07-040336 A | 2/1995 |
| JP | 07-075955 A | 3/1995 |
| JP | 07-076167 A | 3/1995 |
| JP | 7-32281 | 4/1995 |
| JP | 07-263382 A | 10/1995 |
| JP | 07-308791 A | 11/1995 |
| JP | 08-148692 A | 6/1996 |
| JP | 08-197271 A | 8/1996 |
| JP | 08-264488 A | 10/1996 |
| JP | 08-264491 A | 10/1996 |
| JP | 09-017756 A | 1/1997 |
| JP | 09-017831 A | 1/1997 |
| JP | H9-029472 | 2/1997 |
| JP | H09-38958 A | 2/1997 |
| JP | 09-150286 A | 6/1997 |
| JP | 09-213662 A | 8/1997 |
| JP | 09-216085 A | 8/1997 |
| JP | 09-260310 A | 10/1997 |
| JP | 09-263734 A | 10/1997 |
| JP | H09-306839 A | 11/1997 |
| JP | 10-034359 A | 2/1998 |
| JP | 10-071483 A | 3/1998 |
| JP | 10-163780 A | 6/1998 |
| JP | 10-214997 A | 8/1998 |
| JP | 10-233373 A | 9/1998 |
| JP | 10-305420 A | 11/1998 |
| JP | 10-321908 A | 12/1998 |
| JP | H11-10376 A | 1/1999 |
| JP | 11-028586 A | 2/1999 |
| JP | 11-071124 A | 3/1999 |
| JP | 11-121517 A | 4/1999 |
| JP | 11-138896 A | 5/1999 |
| JP | 11-156564 A | 6/1999 |
| JP | 11-160667 A | 6/1999 |
| JP | 11-162889 A | 6/1999 |
| JP | 11-163097 A | 6/1999 |
| JP | 11-163403 A | 6/1999 |
| JP | H11-156568 A | 6/1999 |
| JP | 11-177137 A | 7/1999 |
| JP | 11-177176 A | 7/1999 |
| JP | 11-204551 A | 7/1999 |
| JP | 11-207479 A | 8/1999 |
| JP | 11-221684 A | 8/1999 |
| JP | 11-224866 A | 8/1999 |
| JP | 11-267861 A | 10/1999 |
| JP | 2000-9991 | 1/2000 |
| JP | 2000-015467 A | 1/2000 |
| JP | 3027768 U | 1/2000 |
| JP | 2000-042764 A | 2/2000 |
| JP | 2000-61677 | 2/2000 |
| JP | 3024990 B2 | 3/2000 |
| JP | 2000-104040 A | 4/2000 |
| JP | 2000-124537 A | 4/2000 |
| JP | 2000-133859 A | 5/2000 |
| JP | 2000-158156 A | 6/2000 |
| JP | 2000-195828 A | 7/2000 |
| JP | 2000-210785 A | 8/2000 |
| JP | 2000-216114 A | 8/2000 |
| JP | 2000-219528 A | 8/2000 |
| JP | 2000-237885 A | 9/2000 |
| JP | 2000-237886 A | 9/2000 |
| JP | 2000-247671 A | 9/2000 |
| JP | 2000-249859 A | 9/2000 |
| JP | 2000-278306 A | 10/2000 |
| JP | 2000-294522 A | 10/2000 |
| JP | 2000-323441 A | 11/2000 |
| JP | 2000-349107 A | 12/2000 |
| JP | 2001-047264 A | 2/2001 |
| JP | 2001-064029 A | 3/2001 |
| JP | 2001-085736 A | 3/2001 |
| JP | 2001-127015 A | 5/2001 |
| JP | 2001-135654 A | 5/2001 |
| JP | 2001-144140 A | 5/2001 |
| JP | 2001-196282 A | 7/2001 |
| JP | 2001-250798 A | 9/2001 |
| JP | 2001-284292 A | 10/2001 |
| JP | 2001-326194 A | 11/2001 |
| JP | 2001-345252 A | 12/2001 |
| JP | 2002-026443 A | 1/2002 |
| JP | 2002-047025 A | 2/2002 |
| JP | 2002-050589 A | 2/2002 |
| JP | 2002-158276 A | 5/2002 |
| JP | 2002-192367 A | 7/2002 |
| JP | 2002-192368 A | 7/2002 |
| JP | 2002-192369 A | 7/2002 |
| JP | 2002-192370 A | 7/2002 |
| JP | 2002-192371 A | 7/2002 |
| JP | 2002-205180 A | 7/2002 |
| JP | 2002-205181 A | 7/2002 |
| JP | 2002-224878 A | 8/2002 |
| JP | 2002-226796 A | 8/2002 |
| JP | 2003-001458 A | 1/2003 |
| JP | 2003-017790 A | 1/2003 |

(56) References Cited

FOREIGN PATENT DOCUMENTS

| JP | 2003-039184 A | 2/2003 |
|---|---|---|
| JP | 2003-046177 A | 2/2003 |
| JP | 2003-154517 A | 5/2003 |
| JP | 2003-334812 A | 11/2003 |
| JP | 2003-338467 A | 11/2003 |
| JP | 2003-338468 A | 11/2003 |
| JP | 2003-338636 A | 11/2003 |
| JP | 2005-001001 A | 1/2005 |
| JP | 2005-047290 A | 2/2005 |
| JP | 2005-159378 A | 6/2005 |
| JP | 2005-159379 A | 6/2005 |
| JP | 2005-313237 A | 11/2005 |
| JP | 3722731 B2 | 11/2005 |
| JP | 3761565 | 1/2006 |
| JP | 3761567 | 1/2006 |
| JP | 2006-135355 A | 5/2006 |
| JP | 2008-128723 A | 5/2006 |
| KR | 10-0174773 | 11/1998 |
| KR | 10-1999-0072974 | 9/1999 |
| KR | 2001-017690 | 3/2001 |
| KR | 2001-0017690 A | 3/2001 |
| TW | 165354 | 8/1991 |
| TW | 192484 | 10/1992 |
| TW | 219906 | 2/1994 |
| TW | 404871 B | 9/2000 |
| TW | 415036 B | 12/2000 |
| TW | 428295 B | 4/2001 |
| TW | 429629 B | 4/2001 |
| TW | 440551 B | 6/2001 |
| TW | 443581 U | 6/2001 |
| TW | 445545 B | 7/2001 |
| TW | 445684 B | 7/2001 |
| TW | 455914 B | 9/2001 |
| TW | 473896 B | 1/2002 |
| TW | 488001 B | 5/2002 |
| TW | 505813 B | 10/2002 |
| TW | 512451 B | 12/2002 |
| TW | 521310 B | 2/2003 |
| WO | WO-97/07927 A1 | 3/1997 |
| WO | WO-00/32349 A1 | 6/2000 |
| WO | WO-01/90709 A1 | 11/2001 |
| WO | WO-02/07927 A1 | 1/2002 |
| WO | WO-02/22301 A1 | 3/2002 |
| WO | WO-03/076118 A1 | 9/2003 |
| WO | WO-2004/082006 A1 | 9/2004 |

OTHER PUBLICATIONS

Office Action dated Apr. 25, 2012 from related (not counterpart) U.S. Appl. No. 12/912,427 (33 pages).
U.S. Appl. No. 12/461,969 to Fukuyo et al., filed Aug. 31, 2009.
F. Fumitsugu, "The Stealth Dicing Technologies and Their Applications," Journal of Japan Laser Processing Society, vol. 12, No. 1, Feb. 2005, pp. 17-23, with English translation.
R. Sugiura et al., "The Stealth Dicing Technologies and Their Applications," Proceedings of the 63rd Laser Materials Processing Conference, May 2005, pp. 115-123, with English abstract.
A. Ishii et al., CO2 Laser Processing Technology, Nikkan Kogyo Publishing Production, Dec. 21, 1992, pp. 63-65 (with partial English translation).
Journal of the Japan Society of Griding Engineers, vol. 47, No. 5, May 2003, pp. 229-231, English translation.
K. Hayashi, "Inner Glass Marking by Harmonics of Solid-state Laser," Proceedings of the 45th Laser Materials Processing Conference, Dec. 1998, pp. 23-28, with English abstract.
K. Midorikawa, "Recent Progress of Femtosecond Lasers and Their Applications to Material Processing", Dec. 31, 1998, pp. 29-38, ISBN: 4-947684-21-6, with English language abstract.
The 6th International Symposium on Laser Precision Microfabrication, Apr. 2005, Symposium Program and Technical Digest, including F. Fukuyo et al., "Stealth Dicing Technoligies and Their Applications," English abstract.
T. Yajima et al., *New Version Laser Handbook*, published by Asakura Shoten, Jun. 15, 1989, pp. 666-669.
*Tooling Machine Series, Laser Machining*, published by Taiga Shuppan, Inc., Sep. 10, 1990, pp. 91-96.
*Electronic Material*, No. 9, on 2002, published by Kogyo Chousakai, pp. 17-21.
F. Fukuyo et al., "Stealth Dicing Technology for Ultra Thin Wafer", presented at 2003 ICEP (International Conference on Electronics Packaging), Apr. 16-18, 2003, Tokyo, Japan.
T. Sano et al., "Evaluation of Processing Characteristics of Silicon With Picosecond Pulse Laser," Preprints of the National Meeting of Japan Welding Society, No. 66, Apr. 2000, pp. 72-73.
K. Miura et al., "Formation of Photo-induced Structures in Glasses with Femtosecond Laser," Proceedings of 42nd Laser Materials Processing Conference, Nov. 1997, pp. 105-111.
T. Miyazaki, "Laser Beam Machining Technology," Published by Sangyo-Tosho Inc., May 31, 1991, First Edition, pp. 9-10.
U.S. Appl. No. 13/206,181, filed Aug. 9, 2011.
U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.
K. Hirao et al., "Writing waveguides and gratings in silica and related materials by a femtosecond laser," Journal of Non-Crystalline Solids, vol. 239, Issues 1-3, Oct. 31, 1998, pp. 91-95.
"Welding with High Power Diode Lasers", <http://coherent.com/downloads/HPDDWeldingWhitepaper_Final>.
Petition for Inter Partes Review in parent U.S. Pat. No. 8,268,704.
Office Action mailed Dec. 2, 2011 for U.S. Appl. No. 10/507,321 (during prosecution of the parent '704 patent).
Patent Owner's Reply dated May 25, 2012 to Office Action mailed Dec. 2, 2011 (during prosecution of the parent '704 patent).
Patent Owner's Amendment dated Apr. 20, 2011 (during prosecution of the parent '704 patent).
Am. Heritage Dictionary of the English Language, Houghton Mifflin Co., pp. 600, 719 (3rd Ed. 1996).
English-Language Translation of Japanese Patent Document No. JPH 04111800(A) to Shin.
Declaration of David Baldwin attesting to accuracy of translation of JPH 04111800(A) to Shin.
Hayashi, "Inner Glass Marking by Controlled Optical Damage Formation," The Review of Laser Engineering, vol. 28, Jan. 2000, No. 1, pp. 40-44.
English-Language Translation of Hayashi, "Inner Glass Marking by Controlled Optical Damage Formation," The Review of Laser Engineering, vol. 28, Jan. 2000, No. 1, pp. 40-44.
Declaration of David Baldwin attesting to accuracy of translation of Hayashi, "Inner Glass Marking by Controlled Optical Damage Formation," The Review of Laser Engineering, vol. 28, Jan. 2000, No. 1, pp. 40-44.
Bäuerle D., Laser Processing and Chemistry, Springer-Verlag, p. 6, 3rd ed. 2000.
Declaration of Dr. Haibin Zhang.
Curriculum vita of Dr. Haibin Zhang.
U.S. Appl. No. 15/226,519, filed Aug. 2, 2016.
U.S. Appl. No. 15/226,417, filed Aug. 2, 2016.
U.S. Appl. No. 15/226,662, filed Aug. 2, 2016.

SUBSTRATE DIVIDING METHOD

This is a continuation application of copending application Ser. No. 14/984,066, filed. Dec. 30, 2015, which is a continuation of application Ser. No. 14/793,181, filed on Jul. 7, 2015 (now U.S. Pat. No. 9,287,177), which is a continuation of application Ser. No. 14/517,552, filed on Oct. 17, 2014 (now U.S. Pat. No. 9,142,458), which is a continuation of application Ser. No. 13/953,443, filed on Jul. 29, 2013 (now U.S. Pat. No. 8,889,525), which is a continuation of application Ser. No. 13/618,699, filed on Sep. 14, 2012 (now U.S. Pat. No. 8,519,511), which is a continuation of application Ser. No. 10/507,321, filed on Jun. 28, 2005 (now U.S. Pat. No. 8,268,704), which is the National Stage of International Application No. PCT/JP03/02669 filed Mar. 6, 2003, the entire contents of each of these being incorporated by reference herein in their entirety.

TECHNICAL FIELD

The present invention relates to a substrate dividing method used for dividing a substrate such as a semiconductor substrate in a step of making a semiconductor device or the like.

BACKGROUND ART

As semiconductor devices have been becoming smaller in recent years, there are cases where a semiconductor substrate is thinned to a thickness of several tens of micrometers in a step of making a semiconductor device. When thus thinned semiconductor substrate is cut and divided by a blade, chipping and cracking occur more than in the case where a semiconductor substrate is thicker, thereby causing a problem that the yield of semiconductor chips obtained by dividing the semiconductor substrate decreases.

Known as semiconductor substrate dividing methods which can solve such a problem are those described in Japanese Patent Application Laid-Open Nos. SHO 64-38209 and SHO 62-4341.

In the methods described in these publications, a semiconductor substrate having a front face formed with a functional device is inscribed with a groove by a blade on the front face side, then an adhesive sheet is attached to the front face, so as to hold the semiconductor substrate, and the rear face of the semiconductor substrate is ground until the groove formed beforehand is exposed, thereby thinning the semiconductor substrate and dividing the semiconductor substrate.

DISCLOSURE OF THE INVENTION

If the grinding of the rear face of the semiconductor substrate is performed by surface grinding in the methods described in the above-mentioned publications, however, chipping and cracking may occur at side faces of the groove formed beforehand in the semiconductor substrate when the surface-ground face reaches the groove.

In view of such a circumstance, it is an object of the present invention to provide a substrate dividing method which can prevent chipping and cracking horn occurring, and thin and divide a substrate.

For achieving the above-mentioned object, the substrate dividing method in accordance with the present invention comprises the steps of irradiating a substrate with laser light while positioning a light-converging point within the substrate, so as to form a modified region due to multiphoton absorption within the substrate, and causing the modified region to form a starting point region for cutting along a line along which the substrate should be cut in the substrate inside by a predetermined distance from a laser light incident face of the substrate; and grinding the substrate after the step of forming the starting point region for cutting such that the substrate attains a predetermined thickness.

Since this substrate dividing method irradiates the substrate with laser light while positioning a light-converging point within the substrate in the step of forming a starting point region for cutting, so as to generate a phenomenon of multiphoton absorption within the substrate, thereby forming a modified region, this modified region can form a starting point region for cutting within the substrate along a desirable line along which the substrate should be cut for cutting the substrate. When a starting point region for cutting is formed within the substrate, a fracture is generated in the substrate in its thickness direction from the starting point region for cutting acting as a start point naturally or with a relatively small force exerted thereon.

In the step of grinding the substrate, the substrate is ground such that the substrate attains a predetermined thickness after the starting point region for cutting is formed within the substrate. Here, even when the ground surface reaches the fracture generated from the starting point region for cutting acting as a start point, cut surfaces of the substrate cut by the fracture remain in close contact with each other, whereby the substrate can be prevented from chipping and cracking upon grinding.

This can prevent chipping and cracking from occurring, and can thin and divide the substrate.

Here, the light-converging point refers to a location at which laser light is converged. The grinding encompasses shaving, polishing, chemical etching, and the like. The starting point region for cutting refers to a region to become a start point for cutting when the substrate is cut. Therefore, the starting point region for cutting is a part to cut where cutting is to be performed in the substrate. The starting point region for cutting may be produced by continuously forming a modified region or intermittently forming a modified region.

The substrate encompasses semiconductor substrates such as silicon substrates and GaAs substrates, and insulating substrates such as sapphire substrates and AlN substrates. When the substrate is a semiconductor substrate, an example of the modified region is a molten processed region.

Preferably, a front face of the substrate is formed with a functional device, and a rear face of the substrate is ground in the step of grinding the substrate. Since the substrate can be ground after forming the functional device, a chip thinned so as to conform to a smaller size of a semiconductor device, for example, can be obtained. Here, the functional device refers to light-receiving devices such as photodiodes, light-emitting devices such as laser diodes, circuit devices formed as circuits, etc.

Preferably, the step of grinding the substrate includes a step of subjecting the rear face of the substrate to chemical etching. When the rear face of the substrate is subjected to chemical etching the rear face of the substrate becomes smoother as a matter of course. Also, since the cut surfaces of the substrate cut by the fracture generated from the starting point region for cutting acting as a start point remain in close contact with each other, only edge parts on the rear face of the cut surfaces are selectively etched, so as to be chamfered. This can improve the transverse rupture strength of chips obtained by dividing the substrate, and prevent chipping and cracking from occurring in the chips.

BEST MODES FOR CARRYING OUT THE INVENTION

In the following, a preferred embodiment of the present invention will be explained in detail with reference to drawings. The substrate dividing method in accordance with this method comprises the steps of irradiating a substrate with laser light while positioning a light-converging point within the substrate, so as to form a modified region due to multiphoton absorption within the substrate, thereby forming a starting point region for cutting; and then grinding the substrate such that the substrate attains a predetermined thickness.

First, a laser processing method carried out in the step of forming the starting point region for cutting, multiphoton absorption in particular, will be explained.

A material becomes optically transparent if its absorption bandgap $E_G$ is greater than a photon energy hv. Hence, the condition under which absorption occurs in the material is hv>$E_G$. However, even when optically transparent, the material yields absorption under the condition of nhv>$E_G$ (n=2, 3, 4, . . . ) if the intensity of laser light is very high. This phenomenon is known as multiphoton absorption. In the case of pulse waves, the intensity of laser light is determined by the peak power density (W/cm$^2$) of laser light at a light-converging point thereof. The multiphoton absorption occurs, for example, at a peak power density (W/cm$^2$) of 1×10$^8$ (W/cm$^2$) or higher. The peak power density is determined by (energy per pulse of laser light at the light-converging point)/(laser light beam spot cross-sectional area×pulse width). In the case of a continuous wave, the intensity of laser light is determined by the electric field strength (W/cm$^2$) of laser light at the light-converging point.

Figure 1:
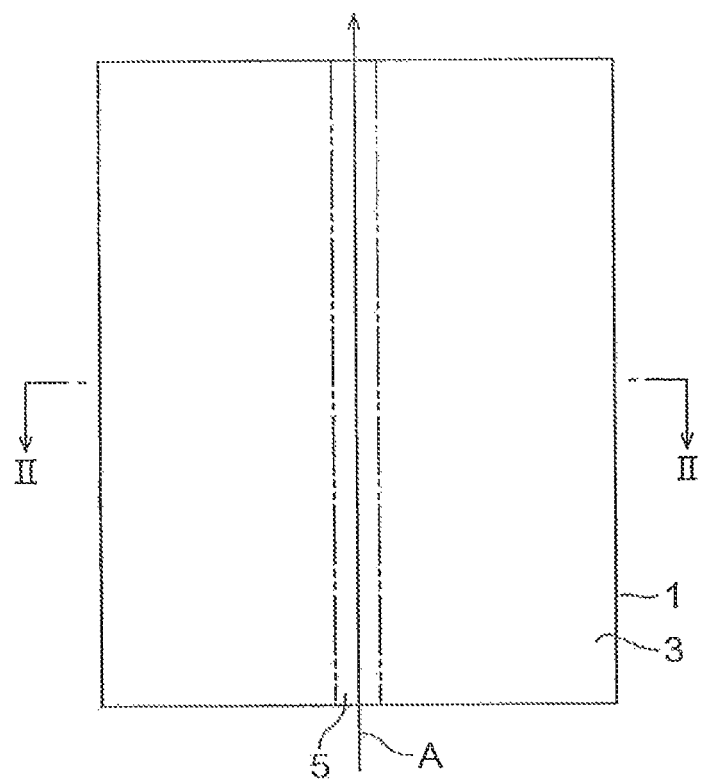
FIG. 1 is a plan view of an object to be processed during laser processing in the laser processing method in accordance with an embodiment of the present invention.
Figure 2:
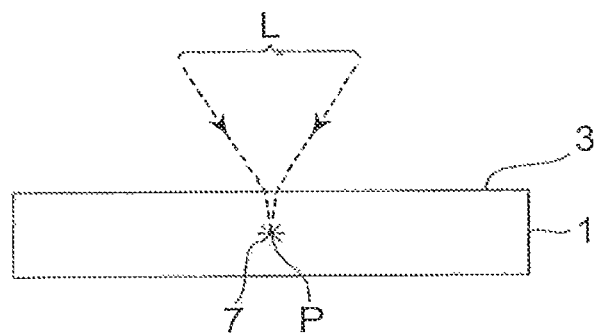
FIG. 2 is a sectional view of the object to be processed taken along the line II-II of FIG. 1.
Figure 3:
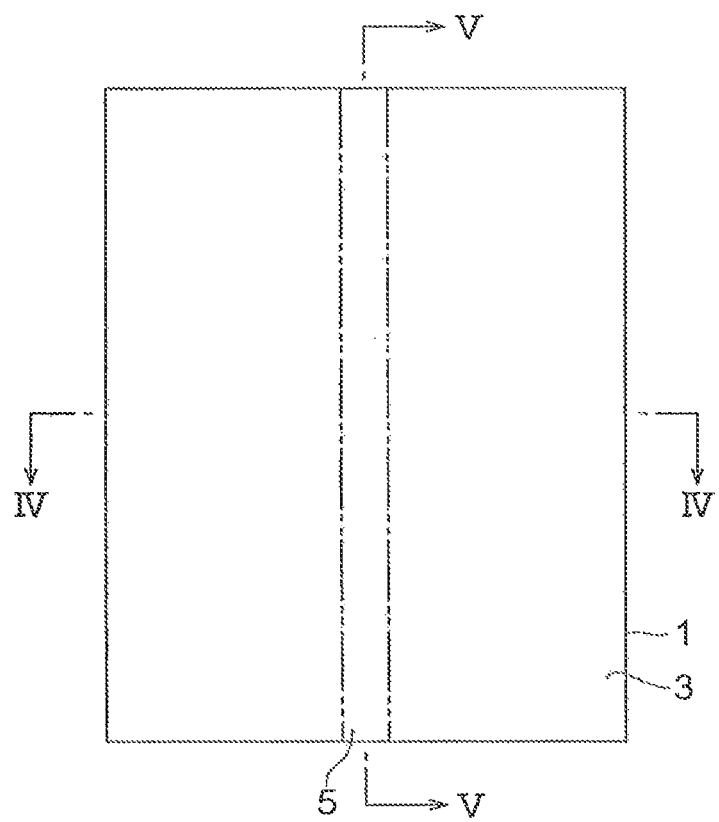
FIG. 3 is a plan view of the object to be processed after laser processing by the laser processing method in accordance with the embodiment.
Figure 4:
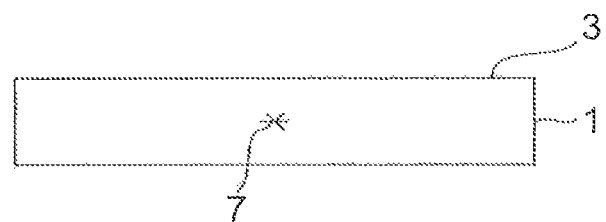
FIG. 4 is a sectional view of the object to be processed taken along the line IV-IV of FIG. 3.
Figure 5:
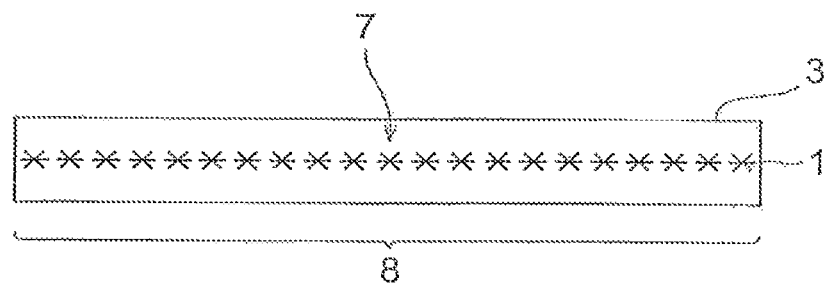
FIG. 5 is a sectional view of the object to be processed taken along the line V-V of FIG. 3.

The principle of laser processing in accordance with the embodiment utilizing such multiphoton absorption will now be explained with reference to FIGS. 1 to 6. FIG. 1 is a plan view of a substrate 1 during laser processing; FIG. 2 is a sectional view of the substrate 1 taken along the line II-II of FIG. 1; FIG. 3 is a plan view of the substrate 1 after laser processing; FIG. 4 is a sectional view of the substrate 1 taken along the line IV-IV of FIG. 3; FIG. 5 is a sectional view of the substrate 1 taken along the line V-V of FIG. 3; and FIG. 6 is a plan view of the cut substrate 1.

As shown in FIGS. 1 and 2, the front face 3 of the substrate 1 has a desirable line along which the substrate should be cut 5 for cutting the substrate 1. The line along which the substrate should be cut 5 is a linearly extending virtual line (the substrate 1 may also be formed with an actual line acting as the line along which the substrate should be cut 5). In the laser processing in accordance with this embodiment, the substrate 1 is irradiated with laser light L such that a light-converging point P is positioned within the semiconductor substrate 1 under a condition causing multiphoton absorption, so as to form a modified region 7. Here, the light-converging point is a location where the laser light L is converged.

The laser light L is relatively moved along the line along which the substrate should be cut 5 (in the direction of arrow A), so as to move the light-converging point P along the line along which the substrate should be cut 5. This forms the modified region 7 along the line along which the substrate should be cut 5 only within the substrate 1 as shown in FIGS. 3 to 5, and the modified region 7 forms a starting point region for cutting (part to cut) 8. In the laser processing method in accordance with this embodiment, no modified region 7 is formed upon heating the substrate 1 by causing the substrate 1 to absorb the laser light L. Instead, the laser light L is transmitted through the semiconductor substrate 1, so as to generate multiphoton absorption within the semiconductor substrate 1, thereby forming the modified region 7. Hence, the laser light L is hardly absorbed by the front face 3 of the semiconductor substrate 1, whereby the front face 3 of the semiconductor substrate 1 does not melt.

Figure 6:
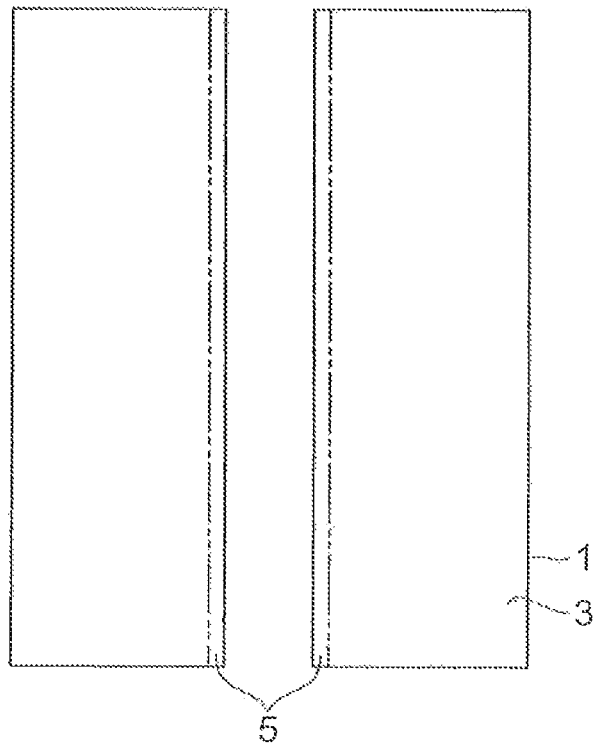
FIG. 6 is a plan view of the object to be processed cut by the laser processing method in accordance with the embodiment.

If a start point exists at a location to cut when cutting the substrate 1, the substrate 1 fractures from this start point and thus can be cut with a relatively small force as shown in FIG. 6. This makes it possible to cut the substrate 1 without generating unnecessary fractures in the front face 3 of the substrate 1.

There seem to be the following two ways of cutting the substrate from the starting point region for cutting acting as a start point. The first case is where, after forming the starting point region for cutting an artificial force is applied to the substrate, so that the substrate fractures from the starting point region for cutting acting as a start point, whereby the substrate is cut. This is the cutting in the case where the substrate has a large thickness, for example. The application of an artificial force encompasses application of bending stress and shearing stress along the starting point region for cutting of the substrate, and exertion of a temperature difference upon the substrate to generate thermal stress, for example. The other case is where a starting point region for cutting is formed, so that the substrate is naturally fractured in a cross-sectional direction (thickness direction) of the substrate from the starting point region for cutting acting as a start point, whereby the substrate is cut. This is enabled, for example, by forming the starting point region for cutting by a single row of modified regions when the substrate has a small thickness, and by a plurality of rows of modified regions aligned in the thickness direction when the substrate has a large thickness. Even in the case of natural fracturing, fractures do not extend to the front face at a location not formed with the starting point region for cutting in the part to cut, whereby only the part corresponding to the location formed with the starting point region for cutting can be fractured. Thus, fracturing can be regulated well. Such a fracturing method with favorable controllability is quite effective, since semiconductor substrates such as silicon wafers have recently been apt to become thinner.

The modified region formed by multiphoton absorption in this embodiment includes the following cases (1) to (3):

(1) Case Where the Modified Region is a Crack Region Including One or a Plurality of Cracks A substrate (e.g., glass or a piezoelectric material made of LiTaO$_3$) is irradiated with laser light while a light-converging point is positioned therewithin under a condition with an electric field intensity of at least 1×10$^8$ (W/cm$^2$) at the light-converging point and a pulse width of 1 μs or less. This pulse width is a condition under which a crack region can be formed only within the substrate while generating multiphoton absorption without causing unnecessary damages to the substrate. This generates a phenomenon of optical damage due to multiphoton absorption within the substrate. This optical damage induces thermal distortion within the substrate, thereby forming a crack region therewithin. The upper limit of electric field intensity is 1×10$^{12}$ (W/cm$^2$), for example. The pulse width is preferably 1 ns to 200 ns, for example. The forming of a crack region due to multiphoton absorption is described, for example, in "Internal Marking of Glass Substrate by Solid-state Laser Harmonics", *Proceedings of 45th Laser Materials Processing Conference* (December 1998), pp. 23-28.

The inventors determined relationships between the electric field intensity and the magnitude of crack by an experiment. Conditions for the experiment are as follows:

(A) Substrate: Pyrex (registered trademark) glass (having a thickness of 700 μm)

(B) Laser

Light source: semiconductor laser pumping Nd:YAG laser

Wavelength: 1064 nm

Laser light spot cross-sectional area: 3.14×10$^{-8}$ cm$^2$

Oscillation mode: Q-switch pulse
Repetition frequency: 100 kHz
Pulse width: 30 ns
Output: output <1 mJ/pulse
Laser light quality: $TEM_{00}$
Polarization characteristic: linear polarization
(C) Light-converging lens
Transmittance with respect to laser light wavelength: 60%
(D) Moving speed of a mounting table mounting the substrate: 100 mm/sec Here, the laser light quality being $TEM_{00}$ indicates that the light convergence is so high that light can be converged up to about the wavelength of laser light.

Figure 7:
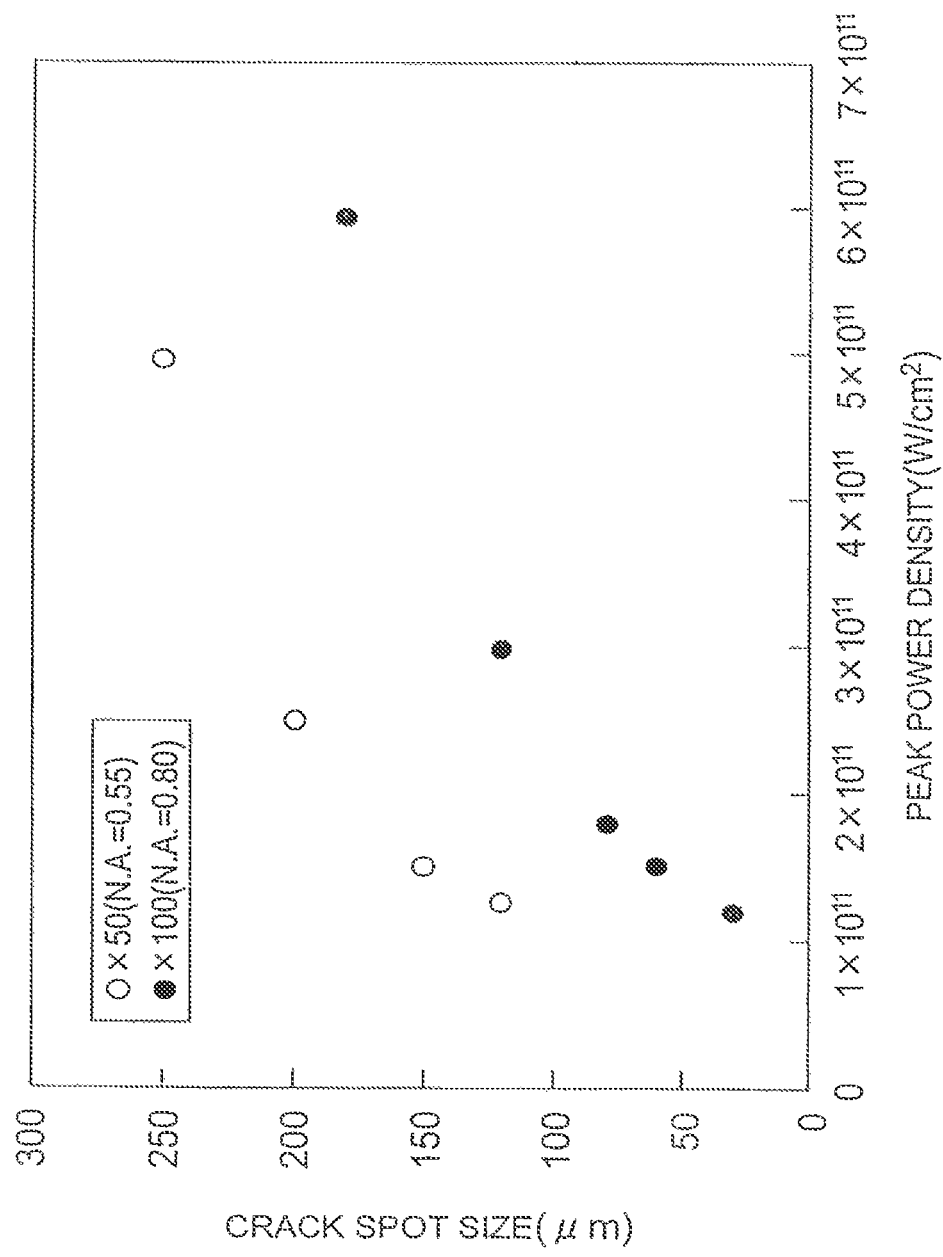
FIG. 7 is a graph showing relationships between the electric field intensity and crack spot size in the laser processing method in accordance with the embodiment.

FIG. 7 is a graph showing the results of the above-mentioned experiment. The abscissa indicates peak power density. Since laser light is pulse laser light, its electric field intensity is represented by the peak power density. The ordinate indicates the size of a crack part (crack spot) formed within the substrate processed by one pulse of laser light. Crack spots gather, so as to form a crack region. The size of a crack spot refers to that of the part of dimensions of the crack spot yielding the maximum length. The data indicated by black circles in the graph refers to a case where the light-converging lens (C) has a magnification of ×100 and a numerical aperture (NA) of 0.80. On the other hand, the data indicated by white circles in the graph refers to a case where the light-converging lens (C) has a magnification of ×50 and a numerical aperture (NA) of 0.55. It is seen that crack spots begin to occur within the substrate when the peak power density reaches about $10^{11}$ (W/cm$^2$), and become greater as the peak power density increases.

Figure 8:
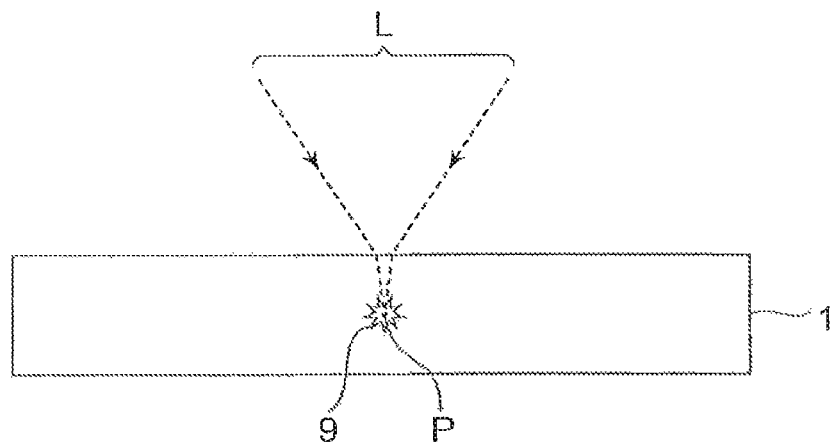
FIG. 8 is a sectional view of the object to be processed in a first step of the laser processing method in accordance with the embodiment.
Figure 9:
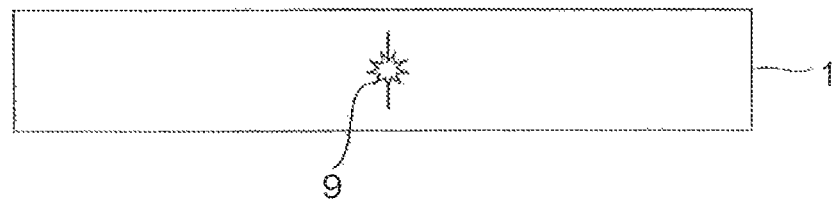
FIG. 9 is a sectional view of the object to be processed in a second step of the laser processing method in accordance with the embodiment.
Figure 10:
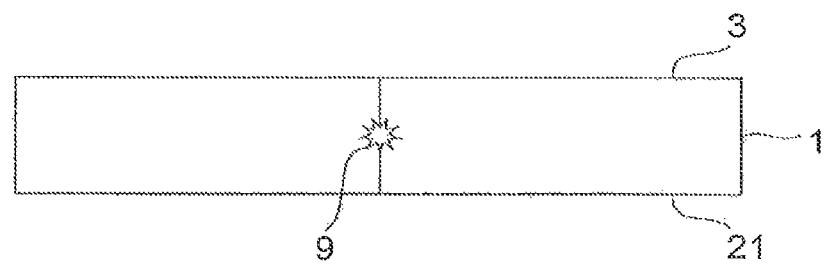
FIG. 10 is a sectional view of the object to be processed in a third step of the laser processing method in accordance with the embodiment.
Figure 11:
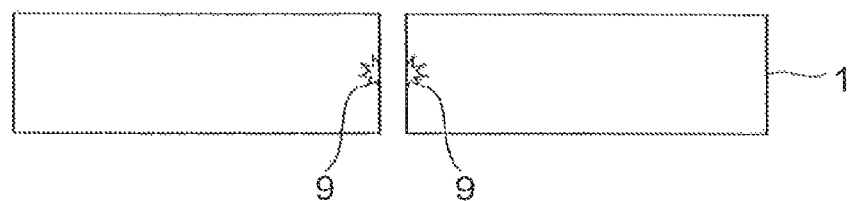
FIG. 11 is a sectional view of the object to be processed in a fourth step of the laser processing method in accordance with the embodiment.

A mechanism by which the substrate is cut upon formation of a crack region in the laser processing in accordance with this embodiment will now be explained with reference to FIGS. 8 to 11. As shown in FIG. 8, the substrate 1 is irradiated with laser light L while positioning the light-converging point P within the substrate 1 under a condition where multiphoton absorption occurs, so as to form a crack region 9 therewithin along a line along which the substrate should be cut. The crack region 9 is a region including one or a plurality of crack spots. The crack region 9 forms a starting point region for cutting. As shown in FIG. 9, the crack further grows while, using the crack region 9 as a start point (i.e., using the starting point region for cutting as a start point). As shown in FIG. 10, the crack reaches the front face 3 and rear face 21 of the substrate 1. As shown in FIG. 11, the substrate 1 breaks, so as to be cut. The crack reaching the front face and rear face of the substrate may grow naturally or grow as a force is applied to the substrate.

(2) Case Where the Modified Region is a Molten Processed Region

A substrate (e.g., a semiconductor material such as silicon) is irradiated with laser light while a light-converging point is positioned therewithin under a condition with an electric field intensity of at least $1\times10^8$ (W/cm$^2$) at the light-converging point and a pulse width of 1 μs or less. As a consequence, the inside of the substrate is locally heated by multiphoton absorption. This heating forms a molten processed region within the substrate. The molten processed region refers to a region once melted and then re-solidified, a region just in a melted state, or a region in the process of re-solidifying from its melted state, and may also be defined as a phase-changed region or a region having changed its crystal structure. The molten processed region may also be regarded as a region in which a certain structure has changed into another structure in monocrystal, amorphous, and polycrystal structures. Namely, it refers to a region in which a monocrystal structure has changed into an amorphous structure, a region in which a monocrystal structure has changed into a polycrystal structure, and a region in which a monocrystal structure has changed into a structure including an amorphous structure and a polycrystal structure, for example. When the substrate is a silicon monocrystal structure, the molten processed region is an amorphous silicon structure, for example. The upper limit of electric field intensity is $1\times10^{12}$ (W/cm$^2$), for example. The pulse width is preferably 1 ns to 200 ns, for example.

Figure 12:
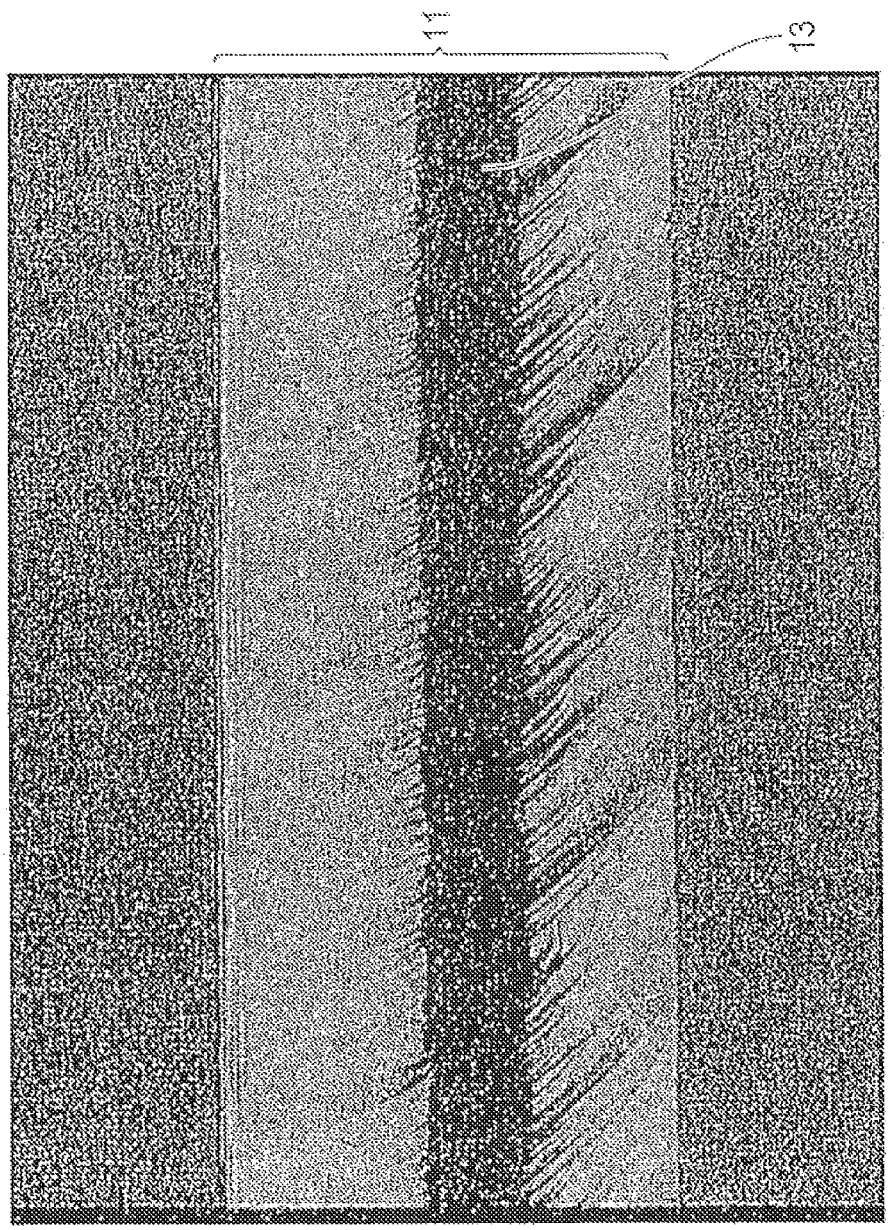
FIG. 12 is a view showing a photograph of a cut section in a part of a silicon wafer cut by the laser processing method in accordance with the embodiment.

By an experiment, the inventors have verified that a molten processed region is formed within a silicon wafer. Conditions for the experiment are as follows:

(A) Substrate: silicon wafer (having a thickness of 350 μm and an outer diameter of 4 inches)
(B) Laser
   Light source: semiconductor laser pumping Nd:YAG laser
   Wavelength: 1064 nm
   Laser light spot cross-sectional area: $3.14\times10^{-8}$ cm$^2$
   Oscillation mode: Q-switch pulse
   Repetition frequency: 100 kHz
   Pulse width: 30 ns
   Output: 20 μJ/pulse
   Laser light quality: $TEM_{00}$
   Polarization characteristic: linear polarization
(C) Light-converging lens
   Magnification: ×50
   N.A.: 0.55
   Transmittance with respect to laser light wavelength: 60%
(D) Moving speed of a mounting table mounting the substrate: 100 mm/sec FIG. 12 is a view showing a photograph of a cut section in a part of a silicon wafer cut by laser processing under the above-mentioned conditions. A molten processed region 13 is formed within a silicon wafer 11. The size of the molten processed region 13 formed under the above-mentioned conditions is about 100 μm in the thickness direction.

Figure 13:
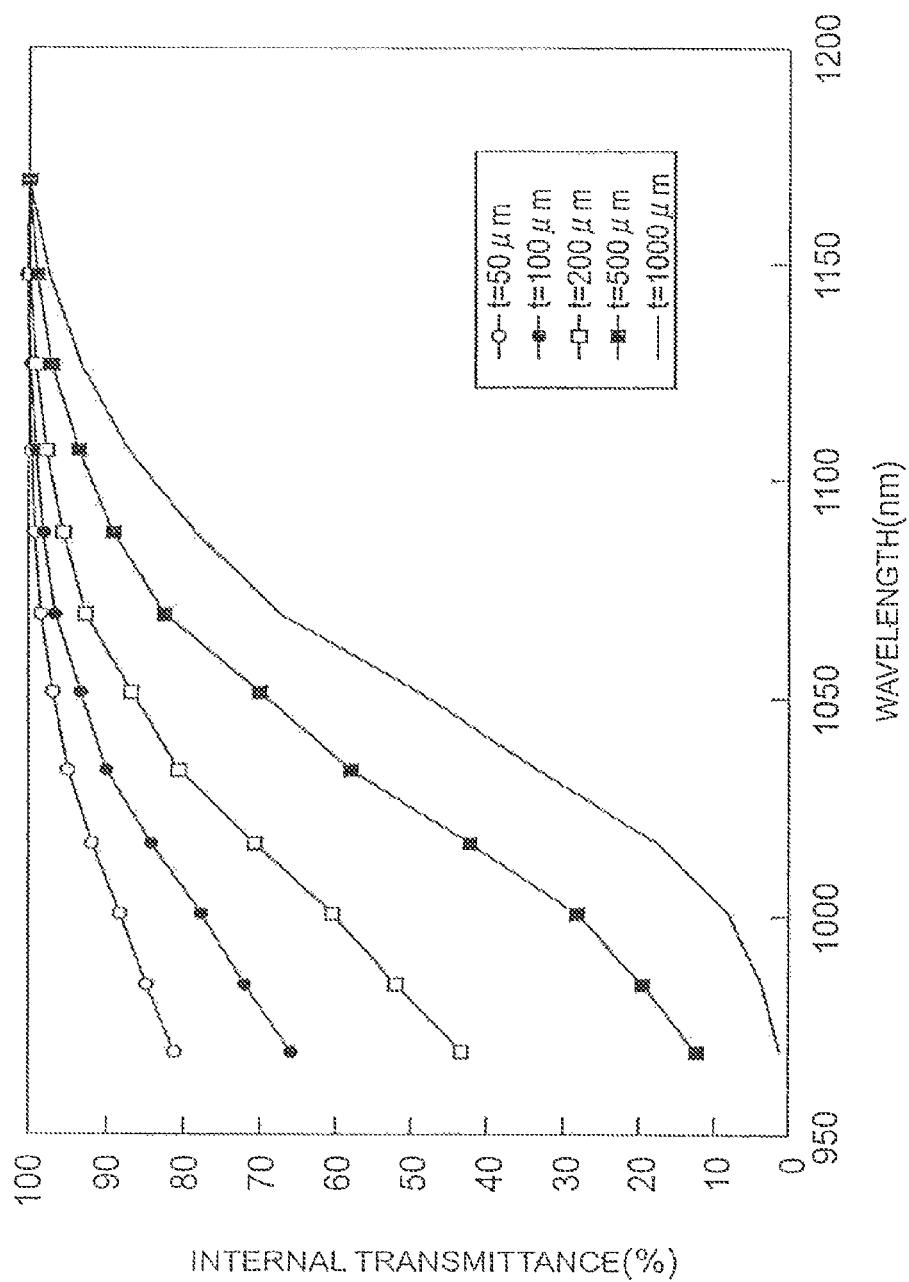
FIG. 13 is a graph showing relationships between the laser light wavelength and the internal transmittance of a silicon substrate in the laser processing method in accordance with the embodiment.

The fact that the molten processed region 13 is formed by multiphoton absorption will now be explained. FIG. 13 is a graph showing relationships between the wavelength of laser light and the transmittance within the silicon substrate. Here, respective reflecting components on the front face side and rear face side of the silicon substrate are eliminated, whereby only the transmittance therewithin is represented. The above-mentioned relationships are shown in the cases where the thickness t of the silicon substrate is 50 μm, 100 μm, 200 μm, 500 μm, and 1000 μm, respectively.

For example, it is seen that laser light transmits through the silicon substrate by at least 80% at 1064 nm; where the wavelength of Nd:YAG laser is located, when the silicon substrate has a thickness of 500 μm or less. Since the silicon wafer 11 shown in FIG. 12 has a thickness of 350 μm, the molten processed region 13 due to multiphoton absorption is formed near the center of the silicon wafer, i.e., at a part separated from the front face by 175 μm. The transmittance in this case is 90% or greater with reference to a silicon wafer having a thickness of 200 μm, whereby the laser light is absorbed within the silicon wafer 11 only slightly and is substantially transmitted therethrough. This means that the molten processed region 13 is not formed by laser light absorption within the silicon wafer 11 (i.e., not formed upon usual heating with laser light), but by multiphoton absorption. The forming of a molten processed region by multiphoton absorption is described, for example, in "Processing Characteristic Evaluation of Silicon by Picosecond Pulse Laser", *Preprints of the National Meeting of Japan Welding Society*, No. 66 (April 2000), pp. 72-73.

Here, a fracture is generated in the cross-sectional direction while using a molten processed region as a start point, whereby the silicon wafer is cut when the fracture reaches the front face and rear face of the silicon wafer. The fracture reaching the front face and rear face of the silicon wafer may grow naturally or grow as a force is applied to the silicon wafer. The fracture naturally grows from the starting point region for cutting to the front face and rear face of the silicon wafer in any of the cases where the fracture grows from the molten processed region in a melted state and where the fracture grows from the molten processed region in the process of re-solidifying from the melted state. In any of these cases, the molten processed region is formed only within the silicon wafer. In the cut section after cutting, the molten processed region is formed only therewithin as shown in FIG. 12. When a molten processed region is formed within the substrate, unnecessary fractures deviating from a line along which the substrate should be cut are hard to occur at the time of fracturing which makes it easier to control the fracturing.

(3) Case Where the Modified Region is a Refractive Index Change Region

A substrate (e.g., glass) is irradiated with laser light while a light-converging point is positioned therewithin under a condition with an electric field intensity of at least $1 \times 10^8$ (W/cm$^2$) at the light-converging point and a pulse width of 1 ns or less. When multiphoton absorption is generated within the substrate with a very short pulse width, the energy caused by multiphoton absorption is not transformed into thermal energy, so that a permanent structural change such as ionic valence change, crystallization, or polarization orientation is induced within the substrate, whereby a refractive index change region is formed. The upper limit of electric field intensity is $1 \times 10^{12}$ (W/cm$^2$), for example. The pulse width is preferably 1 ns or less, more preferably 1 ps or less, for example. The forming of a refractive index change region by multiphoton absorption is described, for example, in "Formation of Photoinduced Structure within Glass by Femtosecond Laser Irradiation", *Proceedings of 42th Laser Materials Processing Conference* (November 1997), pp. 105-111.

The cases of (1) to (3) are explained as modified regions formed by multiphoton absorption in the foregoing. When a starting point region for cutting is formed as follows in view of the crystal structure of the substrate, the cleavage property thereof, and the like, the substrate can be cut with a smaller force and a higher accuracy while using the starting point region for cutting as a start point.

Namely, in the case of a substrate made of a monocrystal semiconductor having a diamond structure such as silicon, the starting point region for cutting is preferably formed in a direction along the (111) plane (first cleavage plane) or (110) plane (second cleavage plane). In the case of a substrate made of a III-V family compound semiconductor having a zinc ore type structure such as GaAs, the starting point region for cutting is preferably formed in a direction along the (110) plane. In the case of a substrate having a hexagonal crystal structure such as sapphire (Al$_2$O$_3$), a starting point region for cutting is preferably formed in a direction along the (1120) plane (A plane) or (1100) plane (M plane) while using the (0001) plane (C plane) as a principal plane.

When the substrate is formed with an orientation flat along a direction to be formed with the starting point region for cutting (e.g., in a direction along the (111) plane in the monocrystal silicon substrate) or a direction orthogonal to the direction to be formed with the starting point region for cutting, the starting point region for cutting extending along the direction to be formed with the starting point region for cutting can be formed in the substrate in an easy and accurate manner with reference to the orientation flat.

In the following, the present invention will be explained more specifically with reference to Examples.

EXAMPLE 1

Example 1 of the substrate dividing method in accordance with the present invention will now be explained. Example 1 is directed to a case where the substrate 1 is a silicon wafer (having a thickness of 350 μm and an outer diameter of 4 inches) ("substrate 1" will hereinafter be referred to as "semiconductor substrate 1" in Example 1), whereas the front face 3 of the semiconductor substrate 1 is formed with a plurality of functional devices in a device manufacturing process.

Figure 14:
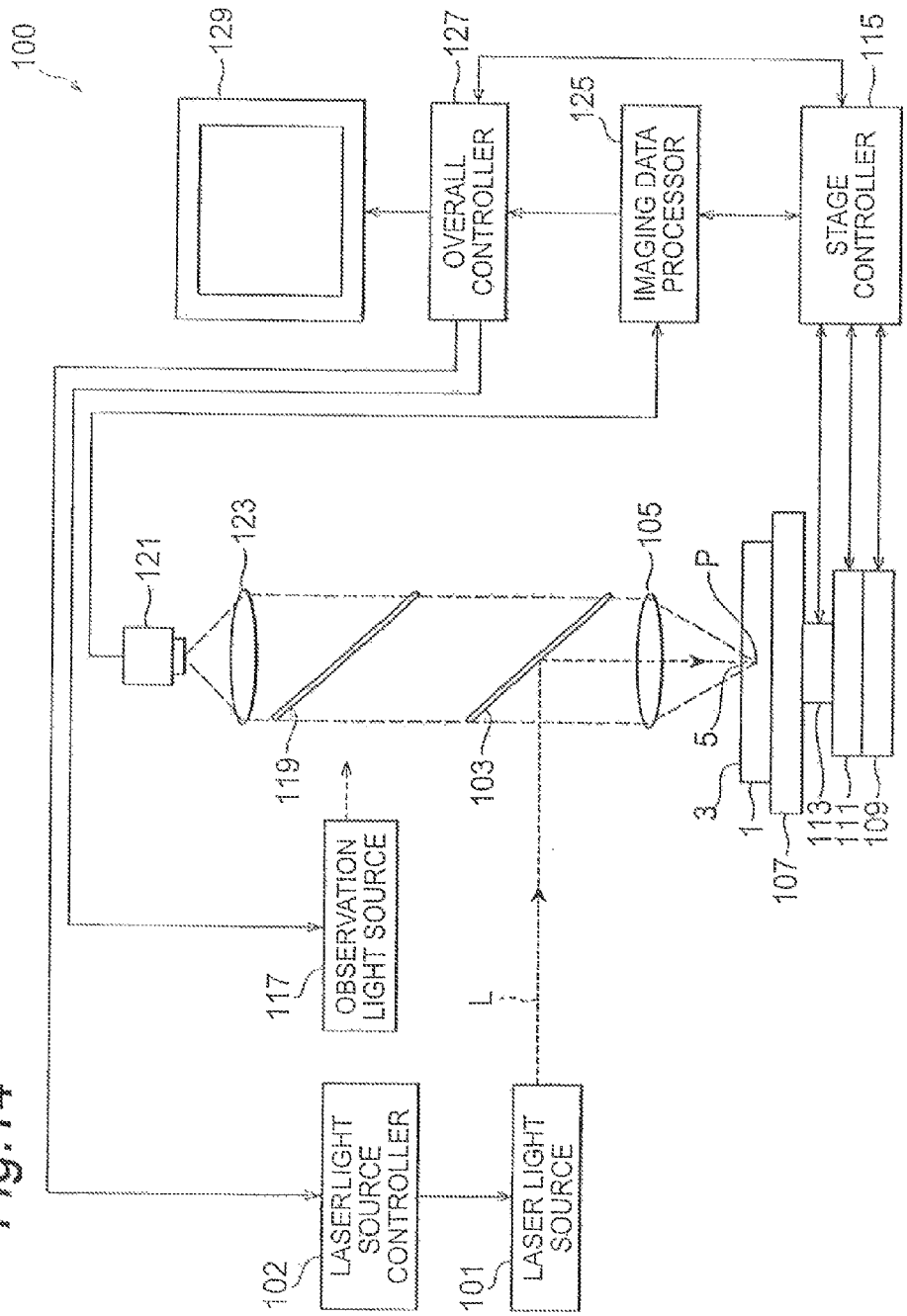
FIG. 14 is a schematic diagram of the laser processing apparatus in accordance with Example 1.

First, before explaining a step of forming a starting point region for cutting within the semiconductor substrate 1, a laser processing apparatus employed in the step of forming a starting point region for cutting will be explained with reference to FIG. 14. FIG. 14 is a schematic diagram of the laser processing apparatus 100.

The laser processing apparatus 100 comprises a laser light source 101 for generating laser light L; a laser light source controller 102 for controlling the laser light source 101 so as to regulate the output, pulse width, etc. of laser light L and the like; a dichroic mirror 103, arranged so as to change the orientation of the optical axis of laser light L by 90°, having a function of reflecting the laser light L; a light-converging lens 105 for converging the laser light L reflected by the dichroic mirror 103; a mounting table 107 for mounting a semiconductor substrate 1 irradiated with the laser light L converged by the light converging lens 105; an X-axis stage 109 for moving the mounting table 107 in the X-axis direction; a Y-axis stage 111 for moving the mounting table 107 in the Y-axis direction orthogonal to the X-axis direction; a Z-axis stage 113 for moving the mounting table 107 in the Z-axis direction orthogonal to the X- and Y-axis directions; and a stage controller 115 for controlling the movement of these three stages 109, 111, 113.

The Z-axis direction is a direction orthogonal to the front face 3 of the semiconductor substrate 1, and thus becomes the direction of focal depth of laser light L incident on the semiconductor substrate 1. Therefore, moving the Z-axis stage 113 in the Z-axis direction can position the light-converging point P of laser light L within the semiconductor substrate 1. This movement of light-converging point P in X(Y)-axis direction is effected by moving the semiconductor substrate 1 in the X(Y)-axis direction by the X(Y)-axis stage 109 (111).

The laser light source 101 is an Nd:YAG laser generating pulse laser light. Known as other kinds of laser usable as the laser light source 101 include Nd:YVO$_4$ laser, Nd:YLF laser, and titanium sapphire laser. For forming a molten processed region, Nd:YAG laser, Nd:YVO$_4$ laser, and Nd:YLF laser are preferably employed. Though pulse laser light is used for processing the semiconductor substrate 1 in Example 1 continuous wave laser light may be used as long as it can cause multiphoton absorption.

The laser processing apparatus 100 further comprises an observation light source 117 for generating a visible light beam for irradiating the semiconductor substrate 1 mounted on the mounting table 107, and a visible light beam splitter 119 disposed on the same optical axis as that of the dichroic mirror 103 and light-converging lens 105. The dichroic mirror 103 is disposed between the beam splitter 119 and light-converging lens 105. The beam splitter 119 has a function of reflecting about a half of a visual light beam and transmitting the remaining half therethrough, and is arranged so as to change the orientation of the optical axis of the visual light beam by 90°. About a half of the visible light beam generated from the observation light source 117 is reflected by the beam splitter 119, and thus reflected visible light beam is transmitted through the dichroic mirror 103 and light-converging lens 105, so as to illuminate the front face 3 of the semiconductor substrate 1 including the line along which the substrate should be cut 5 and the like.

The laser processing apparatus 100 further comprises an image pickup device 121 and an imaging lens 123 which are disposed on the same optical axis as that of the beam splitter 119, dichroic mirror 103, and light-converging lens 105. An example of the image pickup device 121 is a CCD camera. The reflected light of the visual light beam having illuminated the front face 3 including the line along which the substrate should be cut 5 and the like is transmitted through the light-converging lens 105, dichroic mirror 103, and beam splitter 119 and forms an image by way of the imaging lens 123, whereas thus formed image is captured by the image pickup device 121, so as to yield imaging data.

The laser processing apparatus 100 further comprises an imaging data processor 125 for inputting the imaging data outputted from the image pickup device 121, an overall controller 127 for controlling the laser processing apparatus 100 as a whole, and a monitor 129. According to the imaging data, the imaging data processor 125 calculates focal point data for positioning the focal point of the visible light generated from the observation light source 117 onto the front face 3. According to the focal point data, the stage controller 115 controls the movement of the Z-axis stage 113, so that the focal point of visible light is positioned on the front face 3. Hence, the imaging data processor 125 functions as an autofocus unit. Also, according to the imaging data, the imaging data processor 125 calculates image data such as an enlarged image of the front face 3. The image data is sent to the overall controller 127, subjected to various kinds of processing therein, and then sent to the monitor 129. As a consequence, an enlarged image or the like is displayed on the monitor 129.

Data from the stage controller 115, image data from the imaging data processor 125, and the like are fed into the overall controller 127. According to these data as well, the overall controller 127 regulates the laser light source controller 102, observation light source 117, and stage controller 115, thereby controlling the laser processing apparatus 100 as a whole. Thus, the overall controller 127 functions as a computer unit.

Figure 15:
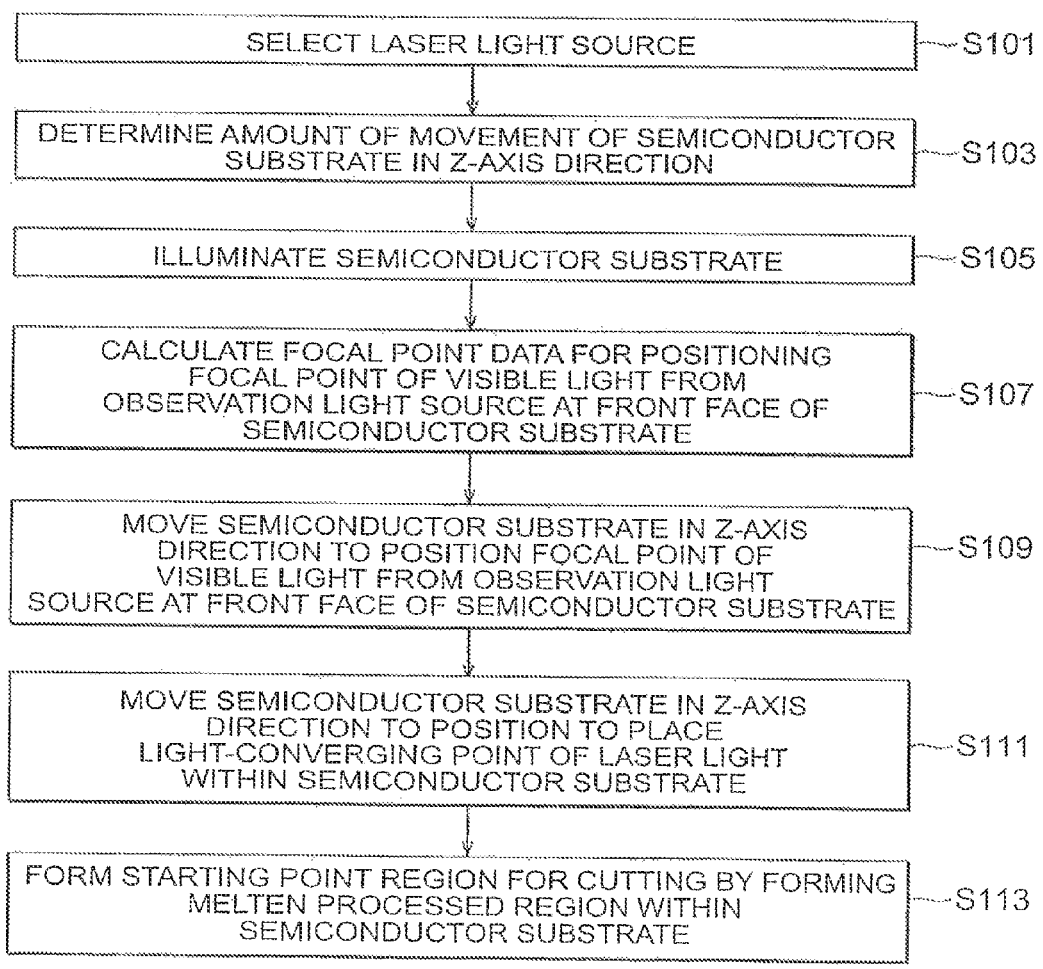
FIG. 15 is a flowchart for explaining the laser processing method in accordance with Example 1.

With reference to FIGS. 14 and 15, a step of forming a starting point region for cutting in the case using the above-mentioned laser processing apparatus 100 will be explained. FIG. 15 is a flowchart for explaining the step of forming a starting point region for cutting.

Light absorption characteristics of the semiconductor substrate 1 are determined by a spectrophotometer or the like which is not depicted. According to the results of measurement, a laser light source 101 generating laser light L having a wavelength to which the semiconductor substrate 1 is transparent or exhibits a low absorption is chosen (S101). Subsequently, the thickness of the semiconductor substrate 1 is measured. According to the result of measurement of thickness and the refractive index of the semiconductor substrate 1, the amount of movement of the semiconductor substrate 1 in the Z-axis direction is determined (S103). This is an amount of movement of the semiconductor substrate 1 in the Z-axis direction with reference to the light-converging point P of laser light L positioned at the front face 3 of the semiconductor substrate 1 in order for the light-converging point P of laser light L to be positioned within the semiconductor substrate 1. This amount of movement is fed into the overall controller 127.

The semiconductor substrate 1 is mounted on the mounting table 107 of the laser processing apparatus 100. Subsequently, visible light is generated from the observation light source 117, so as to illuminate the semiconductor substrate 1 (S105). The illuminated front face 3 of the semiconductor substrate 1 including the line along which the substrate should be cut 5 is captured by the image pickup device 121. The line along which the substrate should be cut 5 is a desirable virtual line for cutting the semiconductor substrate 1. Here, in order to obtain semiconductor chips by dividing the semiconductor substrate 1 into the functional devices formed on its front face 3, the line along which the substrate should be cut 5 is set like a grid running between the functional devices adjacent each other. The imaging data captured by the imaging device 121 is sent to the imaging data processor 125. According to the imaging data, the imaging data processor 125 calculates such focal point data that the focal point of visible light from the observation light source 117 is positioned at the front face 3 (S107).

The focal point data is sent to the stage controller 115. According to the focal point data, the stage controller 115 moves the Z-axis stage 113 in the Z-axis direction (S109). As a consequence, the focal point of visible light from the observation light source 117 is positioned at the front face 3 of the semiconductor substrate 1. According to the imaging data, the imaging data processor 125 calculates enlarged image data of the front face 3 of the semiconductor substrate 1 including the line along which the substrate should be cut 5. The enlarged image data is sent to the monitor 129 by way of the overall controller 127, whereby an enlarged image of the line along which the substrate should be cut 5 and its vicinity is displayed on the monitor 129.

Movement amount data determined in step S103 has been fed into the overall controller 127 beforehand, and is sent to the stage controller 115. According to the movement amount data, the stage controller 115 causes the Z-axis stage 113 to move the substrate 1 in the Z-axis direction to a position where the light-converging point P of laser light L is positioned within the semiconductor substrate 1 (S111).

Subsequently, laser light L is generated from the laser light source 101, so as to irradiate the line along which the substrate should be cut 5 in the front face 3 of the semiconductor substrate 1. Then, the X-axis stage 109 and Y-axis stage 111 are moved along the line along which the substrate should be cut 5, so as to form a molten processed region along the line along which the substrate should be cut 5, thereby forming a starting point region for cutting within the semiconductor substrate 1 along the line along which the substrate should be cut 5 (S113).

The foregoing completes the step of forming a starting point region for cutting, thereby forming the starting point region for cutting within the semiconductor substrate 1. When the starting point region for cutting is formed within the semiconductor substrate 1, a fracture is generated in the thickness direction of the semiconductor substrate 1 from the starting point region for cutting acting as a start point naturally or with a relatively small force exerted thereon.

Figure 16:
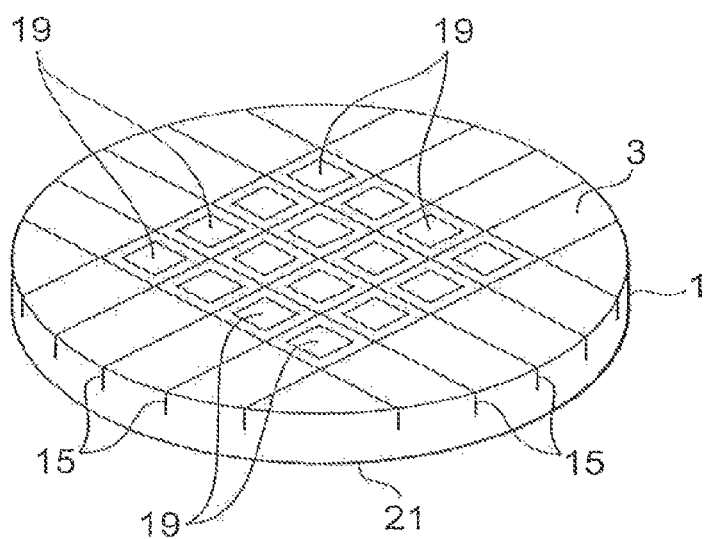
FIG. 16 is a view showing the semiconductor substrate after a step of forming a starting point region for cutting in accordance with Example 1.

In Example 1, the starting point region for cutting is formed at a position near the front face 3 side within the semiconductor substrate 1 in the above-mentioned step of forming a starting point region for cutting, and a fracture is generated in the thickness direction of the semiconductor substrate 1 from the starting point region for cutting acting as a start point. FIG. 16 is a view showing the semiconductor substrate 1 after the starting point region for cutting is formed. As shown in FIG. 16, fractures 15 generated from the starting point region for cutting acting as a start point are formed like a grid along lines to cut, and reach only the front face 3 of the semiconductor substrate 1 but not the rear face 21 thereof. Namely, the fractures 15 generated in the semiconductor substrate 1 separate a plurality of functional devices 19 formed like a matrix on the front face of the semiconductor substrate 1 from each other. The cut surfaces of the semiconductor substrate 1 cut by the fractures 15 are in close contact with each other.

Here, "the starting point region for cutting is formed at a position near the front face 3 side within the semiconductor substrate 1" means that a modified region such as a molten processed region constituting a starting point region for cutting is formed so as to shift from the center position in the thickness direction of the semiconductor substrate 1 (i.e., half thickness position) toward the front face 3. Namely, it refers to a case where the center position of the width of the modified region in the thickness direction of the semiconductor substrate 1 is shifted toward the front face 3 from the center position in the thickness direction of the semiconductor substrate 1, and is not limited to the case where the whole modified region is located on the front face 3 side from the center position in the thickness direction of the semiconductor substrate 1.

The step of grinding the semiconductor substrate 1 will now be explained with reference to FIGS. 17 to 21. FIGS. 17 to 21 are views for explaining respective steps including the step of grinding the semiconductor substrate. In Example 1, the semiconductor substrate 1 is thinned from the thickness of 350 µm to a thickness of 50 µm.

Figure 17:
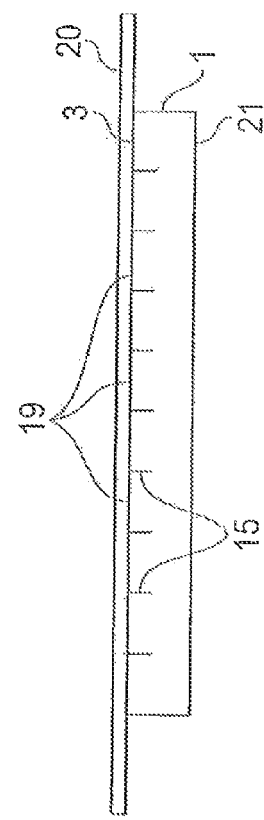
FIG. 17 is a view for explaining a step of attaching a protective film in accordance with Example 1.
Figure 18:
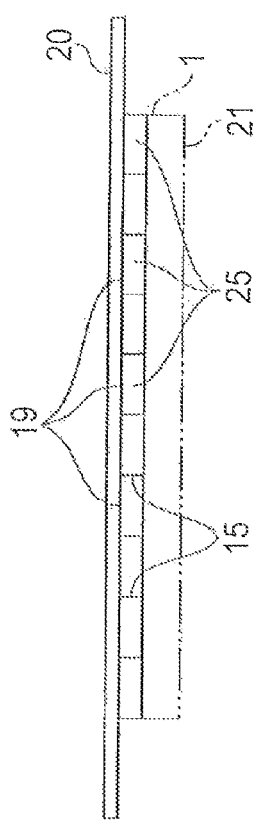
FIG. 18 is a view for explaining a step of grinding the semiconductor substrate in accordance with Example 1.

As shown in FIG. 17, protective film 20 is attached to the front face 3 of the semiconductor substrate after the starting point region for cutting is formed. The protective film 20 is used for protecting the functional devices 19 formed on the front face 3 of the semiconductor substrate 1 and holding the semiconductor substrate 1. Subsequently, as shown in FIG. 18, the rear face 21 of the semiconductor substrate 1 is subjected to surface grinding and then chemical etching, whereby the semiconductor substrate 1 is thinned to the thickness of 50 µm. As a consequence, i.e., because of the grinding of the rear face 21 of the semiconductor substrate 1, the rear face 21 reaches the fractures 15 generated from the starting point region for cutting acting as a start point, whereby the semiconductor substrate 1 is divided into semiconductor chips 25 having the respective functional devices 19. Examples of the chemical etching include wet etching ($HF \cdot HNO_3$) and plasma etching ($HBr \cdot Cl_2$).

Figure 19:
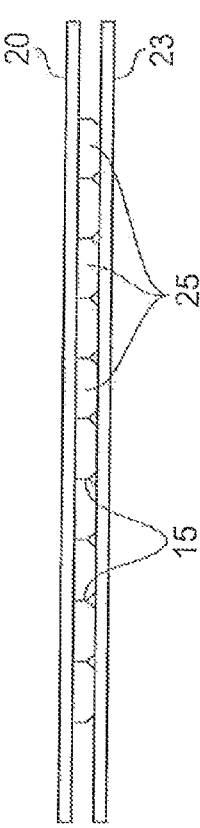
FIG. 19 is a view for explaining a step of attaching an expansion film in accordance with Example 1.
Figure 20:
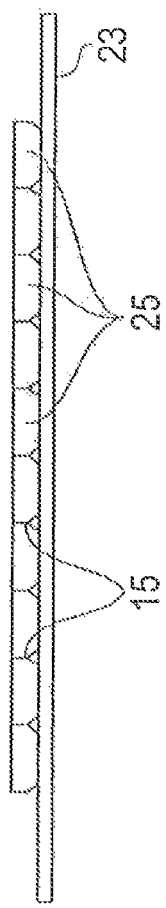
FIG. 20 is a view for explaining a step of peeling the protective film in accordance with Example 1.
Figure 21:
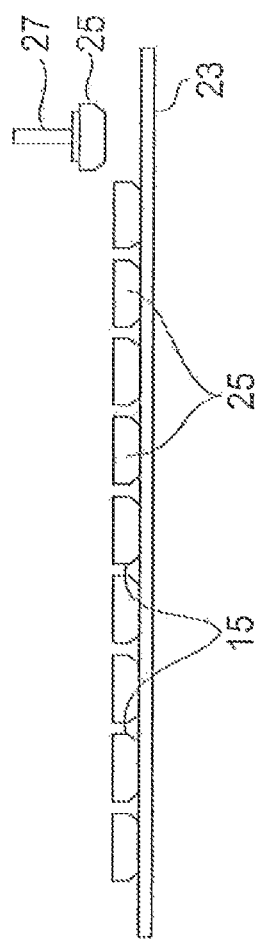
FIG. 21 is a view for explaining a step of expanding the expansion film and picking up semiconductor chips in accordance with Example 1.

Then, as shown in FIG. 19, an expansion film 23 is attached so as to cover the rear faces of all the semiconductor chips 25. Thereafter, as shown in FIG. 20, the protective film 20 attached so as to cover the functional devices of all the semiconductor chips 25 are peeled off. Subsequently, as shown in FIG. 21, the expansion film 23 is expanded, so that the semiconductor chips 25 are separated from each other, and a suction collet 27 picks up the semiconductor chips 25.

As explained in the foregoing, the substrate dividing method in accordance with Example 1 can grind the rear face 21 of the semiconductor substrate 1 after forming the functional devices 19 on the front face 3 of the semiconductor substrate 1 in the device manufacturing process. Also, because of the following effects respectively exhibited by the step of forming a starting point region for cutting and the step of grinding the semiconductor substrate, the semiconductor chips 25 thinned so as to respond to the smaller size of semiconductor devices can be obtained with a favorable yield.

Namely, the step of forming a starting point region for cutting can prevent unnecessary fractures and melting deviated from a desirable line along which the substrate should be cut for cutting the semiconductor substrate 1 from occurring, and thus can keep unnecessary fractures and melting from occurring in the semiconductor chips 25 obtained by dividing the semiconductor substrate 1.

The step of forming a starting point region for cutting does not melt the front face 3 of the semiconductor substrate 1 along the line along which the substrate should be cut, and thus can narrow the gap between the functional devices 19 adjacent each other, thereby making it possible to increase the number of semiconductor chips 25 separated from one semiconductor substrate 1.

On the other hand, the step of grinding the semiconductor substrate subjects the rear face 21 of the semiconductor substrate 1 to surface grinding such that the semiconductor substrate 1 attains a predetermined thickness after the starting point region for cutting is formed within the semiconductor substrate 1. Here, even if the rear face 21 reaches the fractures 15 generated from the starting point region for cutting acting as a start point, the cut surfaces of the semiconductor substrate 1 cut by the fractures 15 are in close contact with each other, whereby the semiconductor substrate 1 can be prevented from chipping and cracking because of the surface grinding. Therefore, the semiconductor substrate 1 can be made thinner and divided while preventing the chipping and cracking from occurring.

The close contact of the cut surfaces in the semiconductor substrate 1 is also effective in preventing the grinding dust caused by the surface grinding from entering the fractures 15, and keeping the semiconductor chips 25 obtained by dividing the semiconductor substrate 1 from being contaminated with the grinding dust. Similarly, the close contact of the cut surfaces in the semiconductor substrate 1 is effective in reducing the chip-off of the semiconductor chips 25 caused by the surface grinding as compared with the case where the semiconductor chips 25 are separated from each other. Namely, as the protective film 20, one with a low holding power can be used.

Figure 22:
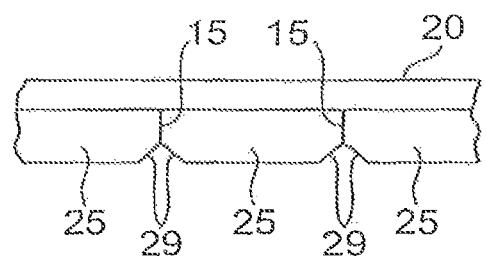
FIG. 22 is a view showing chamfers formed at edge parts on the rear face side of cut surfaces of semiconductor chips after the step of grinding the semiconductor substrate in accordance with Example 1.

Since the rear face 21 of the semiconductor substrate 1 is subjected to chemical etching, the rear faces of the semiconductor chips 25 obtained by dividing the semiconductor substrate 1 can be made smoother. Further, since the cut surfaces of the semiconductor substrate 1 caused by the fractures 15 generated from the starting point region for cutting acting as a start point are in close contact with each other, only edge parts of the cut surfaces on the rear face side are selectively etched as shown in FIG. 22, whereby chamfers 29 are formed. Therefore, the transverse rupture strength of the semiconductor chips 25 obtained by dividing the semiconductor substrate 1 can be improved, and the chipping and cracking in the semiconductor chips 25 can be prevented from occurring.

Figure 23A:
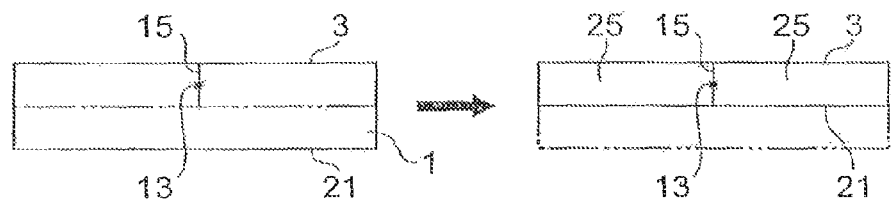
FIG. 23A is a view for explaining a case where a molten processed region remains in a cut surface of a semiconductor chip after the step of grinding the semiconductor substrate in accordance with Example 1, while a fracture reaches the front face before the step of grinding the semiconductor substrate.
Figure 23B:
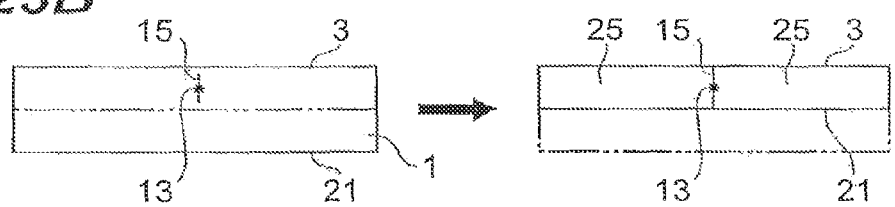
FIG. 23B is a view for explaining a case where a molten processed region remains in a cut surface of a semiconductor chip after the step of grinding the semiconductor substrate in accordance with Example 1, while a fracture does not reach the front face before the step of grinding the semiconductor substrate.
Figure 24A:
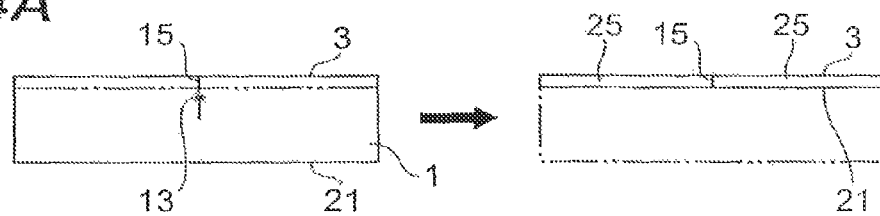
FIG. 24A is a view for explaining a case where a molten processed region does not remain in a cut surface of a semiconductor chip after the step of grinding the semiconductor substrate in accordance with Example 1, while a fracture reaches the front face before the step of grinding the semiconductor substrate.
Figure 24B:
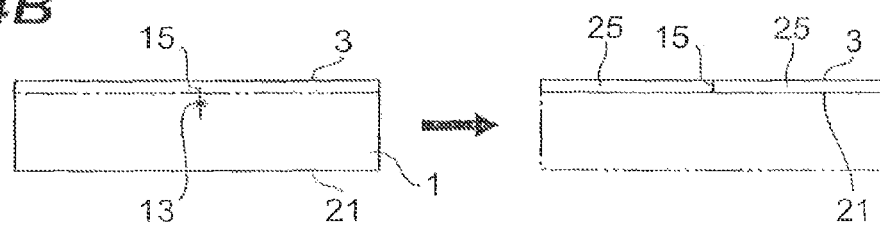
FIG. 24B is a view for explaining a case where a molten processed region does not remain in a cut surface of a semiconductor chip after the step of grinding the semiconductor substrate in accordance with Example 1 while a fracture does not reach the front face before the step of grinding the semiconductor substrate.
Figure 25A:
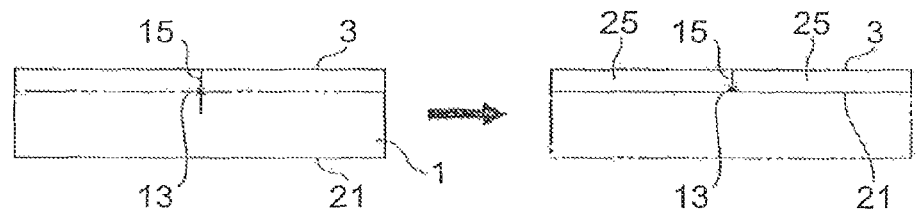
FIG. 25A is a view for explaining a case where a molten processed region remains in an edge part on the rear face side of a cut surface of a semiconductor chip after the step of grinding the semiconductor substrate in accordance with Example 1, while a fracture reaches the front face before the step of grinding the semiconductor substrate.
Figure 25B:
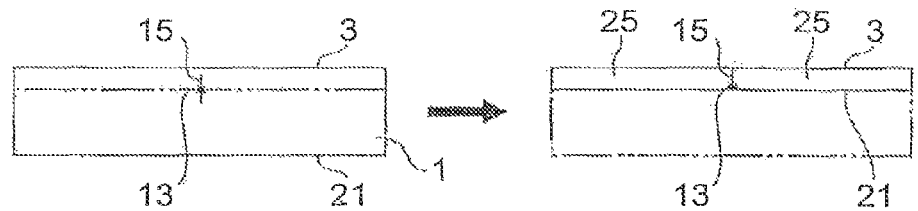
FIG. 25B is a view for explaining a case where a molten processed region remains in an edge part on the rear face side of a cut surface of a semiconductor chip after the step of grinding the semiconductor substrate in accordance with Example 1, while a fracture does not reach the front face before the step of grinding the semiconductor substrate.

The relationship between the semiconductor chip 25 and the molten processed region 13 after the step of grinding the semiconductor substrate includes those shown in FIGS. 23A to 25B. The semiconductor chips 25 shown in these drawings have their respective effects explained later, and thus can be used according to various purposes. FIGS. 23A, 24A, and 25A show the case where the fracture 15 reaches the front face 3 of the semiconductor substrate 1 before the step of grinding the semiconductor substrate, whereas FIGS. 23B, 24B, and 25B show the case where the fracture 15 does not reach the front face 3 of the semiconductor substrate 1 before the step of grinding the semiconductor substrate. Even in the case of FIGS. 23B, 24B, and 25B, the fracture 15 reaches the front face 3 of the semiconductor substrate 1 after the step of grinding the semiconductor substrate.

In the semiconductor chip 25 having the molten processed region 13 remaining within the cut surface as shown in FIGS. 23A and 23B, the cut surface is protected by the molten processed region 13, whereby the transverse rupture strength of the semiconductor chip 25 improves.

The semiconductor chip 25 in which the molten processed region 13 does not remain within the cut surface as shown in FIGS. 24A and 24B is effective in the case where the molten processed region 13 does not favorably influence the semiconductor device.

In the semiconductor chip 25 in which the molten processed region 13 remains in an edge part on the rear face side of the cut surface as shown in FIGS. 25A and 25B, the edge part is protected by the molten processed region 13, whereby the chipping and cracking in the edge part can be prevented from occurring as in the case where the edge part of the semiconductor chip 25 is chamfered.

The rectilinearity of the cut surface obtained, after the step of grinding the semiconductor substrate improves more in the case where the fracture 15 does not reach the front face 3 of the semiconductor substrate 1 before the step of grinding the semiconductor substrate as shown in FIGS. 23B, 24B, and 25B than in the case where the fracture 15 reaches the front face 3 of the semiconductor substrate 1 before the step of grinding the semiconductor substrate as shown in FIGS. 23A, 24A, and 25A.

Whether the fracture reaches the front face 3 of the semiconductor substrate 1 or not depends on not only the depth of the molten processed region 13 from the front face 3, but also the size of the molten processed region 13. Namely, when the molten processed region 13 is made smaller, the fracture 15 does not reach the front face 3 of the semiconductor substrate 1 even if the depth of the molten processed region 13 from the front face 3 is small. The size of the molten processed region 13 can be controlled by the output of the pulse laser light in the step of forming a starting point region for cutting, for example, and becomes greater and smaller as the output of the pulse laser light is higher and lower, respectively.

Figure 26A:
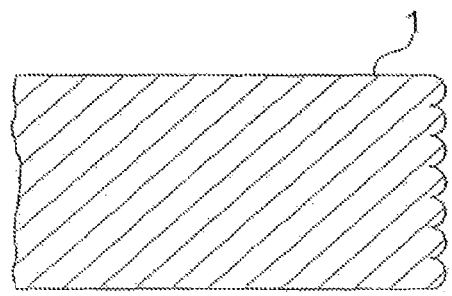
FIG. 26A is a sectional view of a marginal part of the semiconductor substrate before the step of grinding the semiconductor substrate in accordance with Example 1.
Figure 26B:
FIG. 26B is a sectional view of the marginal part of the semiconductor substrate after the step of grinding the semiconductor substrate in accordance with Example 1.
Figure 27:
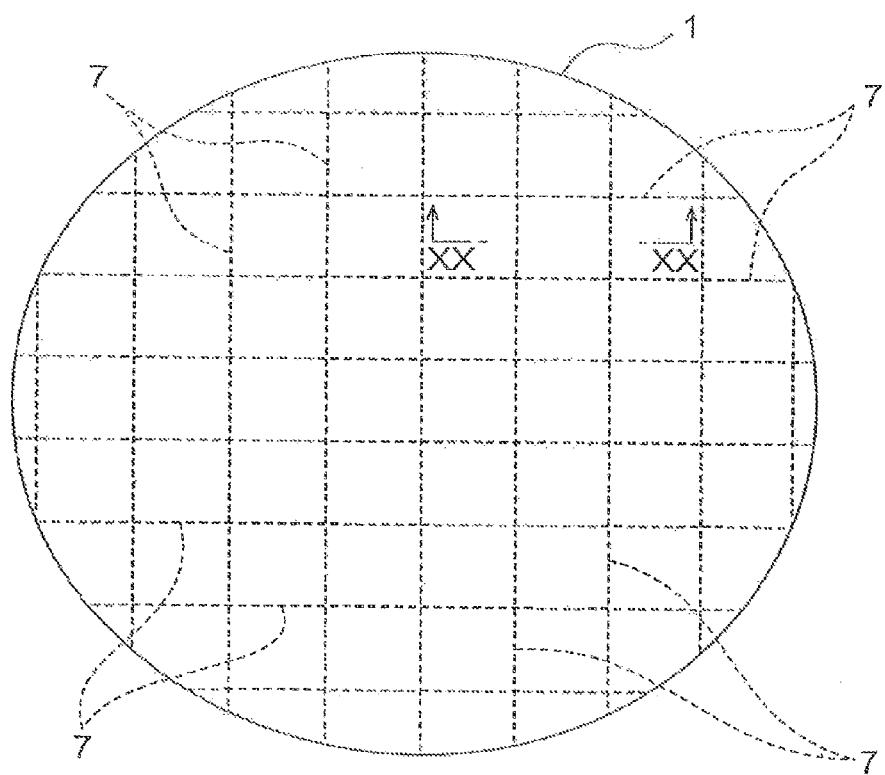
FIG. 27 is a plan view of the sapphire substrate in accordance with Example 2.

In view of a predetermined thickness of the semiconductor substrate 1 thinned in the step of grinding the semiconductor substrate, it is preferred that marginal parts (outer peripheral parts) of the semiconductor substrate 1 be rounded by at least the predetermined thickness by chamfering beforehand (e.g., before the step of forming a starting point region for cutting). FIGS. 26A and 26B are respective sectional views of a marginal part of the semiconductor substrate 1 before and after the step of grinding the semiconductor substrate in accordance with Example 1. The thickness of the semiconductor 1 shown in FIG. 26A before the step of grinding the semiconductor substrate is 350 µm, whereas the thickness of the semiconductor 1 shown in FIG. 26B after the step of grinding the semiconductor substrate is 50 µm. As shown in FIG. 26A, a plurality of (seven here) rounded portions are formed at the marginal part of the semiconductor substrate 1 beforehand by chamfering with a thickness of 50 µm each i.e., the marginal part of the semiconductor substrate 1 is caused to have a wavy form. As a consequence, the marginal part of the semiconductor substrate 1 after the step of grinding the semiconductor substrate 1 attains a state rounded by chamfering as shown in FIG. 26B, whereby the chipping and cracking can be prevented from occurring at the marginal part, and handling can be made easier because of an improvement in mechanical strength.

EXAMPLE 2

Example 2 of the substrate dividing method in accordance with the present invention will now be explained with reference to FIGS. 27 to 35. Example 2 relates to a case where the substrate 1 is a sapphire substrate (having a thickness of 450 µm and an outer diameter of 2 inches) which is an insulating substrate ("substrate 1" will hereinafter be referred to as "sapphire substrate 1" in Example 2), so as to yield a semiconductor chip to become a light-emitting diode. FIGS. 28 to 35 are sectional views of the sapphire substrate 1 taken along the line XX-XX of FIG. 27.

Figure 28:
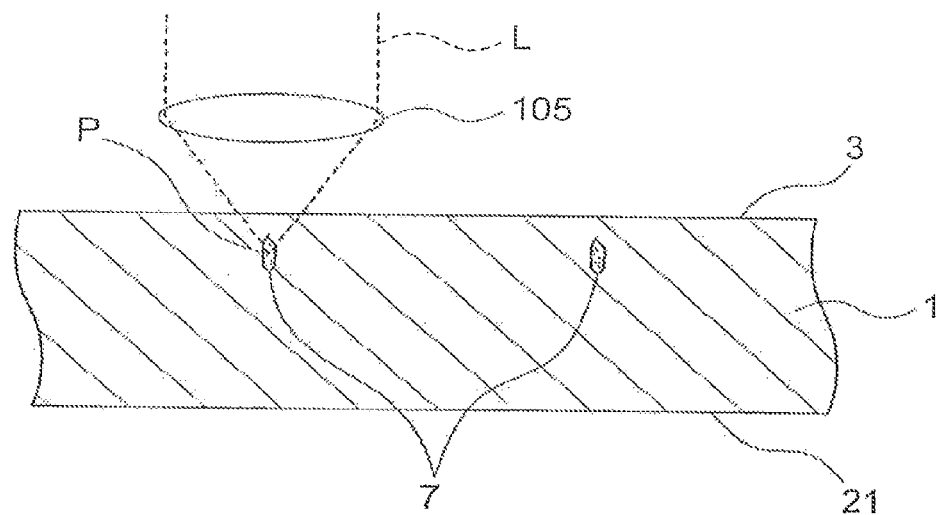
FIG. 28 is a sectional view for explaining a step of forming a starting point region for cutting in accordance with Example 2.
Figure 29:
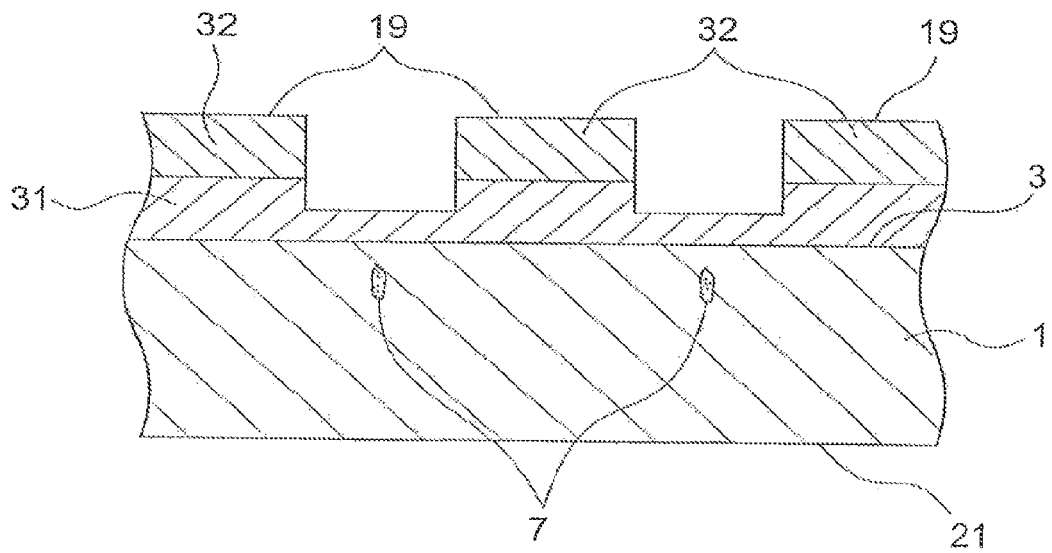
FIG. 29 is a sectional view for explaining a step of forming a functional device in accordance with Example 2.
Figure 30:
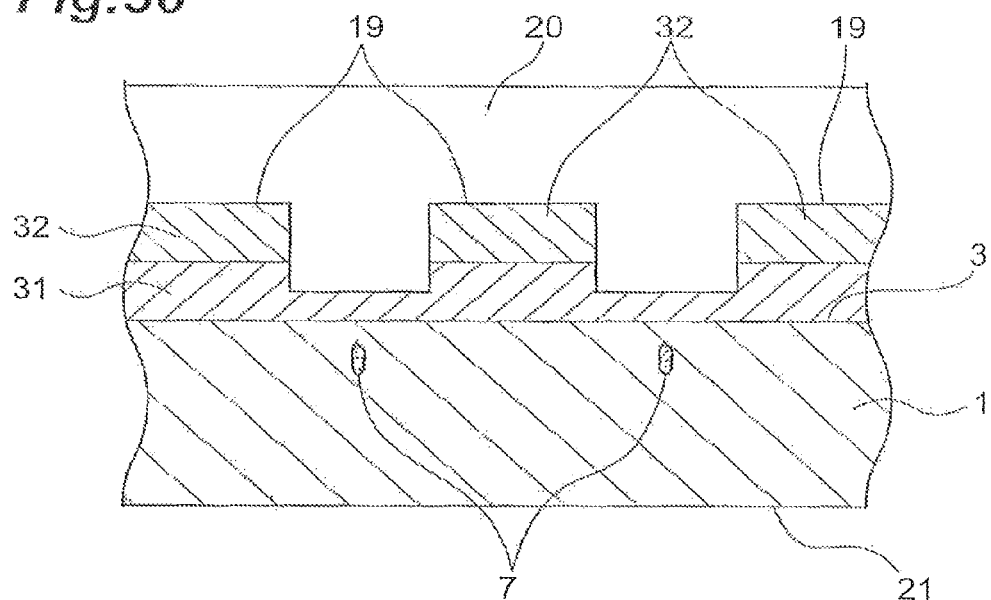
FIG. 30 is a sectional view for explaining a step of attaching a protective film in accordance with Example 2.

First, as shown in FIG. 28, the sapphire substrate 1 is irradiated with laser light L while a light-converging point P is positioned therewithin, so as to form a modified region 7 within the sapphire substrate 1. In a later step, a plurality of functional devices 19 are formed like a matrix on the front face 3 of the sapphire substrate 1, and the sapphire substrate 1 is divided into the functional devices 19. Therefore, lines to cut are formed like a grid in conformity to the size of each functional device 19 as seen from the front face 3 side, modified regions 7 are formed along the lines to cut, and the modified regions 7 are used as starting point regions for cutting.

When the sapphire substrate 1 is irradiated with laser light under a condition with an electric field intensity of at least $1 \times 10^8$ (W/cm$^2$) at the light-converging point P and a pulse width of 1 µs or less, a crack region is formed as the modified region 7 (there is also a case where a molten processed region is formed). When the (0001) plane of the sapphire substrate 1 is employed as the front face 3, and a modified region 7 is formed in a direction along the (1120) plane and a direction orthogonal thereto, the substrate can be cut by a smaller force with a favorable accuracy from the starting point region for cutting formed by the modified region 7 as a start point. The same holds when a modified region. 7 is formed in a direction along the (1100) plane and a direction orthogonal thereto.

After the starting point region for cutting is formed by the modified region 7, an n-type gallium nitride compound semiconductor layer (hereinafter referred to as "n-type layer") 31 is grown as a crystal until its thickness becomes 6 µm on the front face 3 of the sapphire substrate 1, and a p-type gallium nitride compound semiconductor layer (hereinafter referred to as "p-type layer") 32 is grown as a crystal until its thickness becomes 1 µm on the n-type layer 31. Then, the n-type layer 31 and p-type layer 32 are etched to the middle of the n-type layer 31 along the modified regions 7 formed like a grid, so as to form a plurality of functional devices 19 made of the n-type layer 31 and p-type layer 32 into a matrix.

After the n-type layer 31 and p-type layer 32 are formed on the front face 3 of the sapphire substrate 1, the sapphire substrate 1 may be irradiated with laser light L while the light-converging point P is positioned therewithin, so as to form the modified regions 7 within the sapphire substrate 1. The sapphire substrate 1 may be irradiated with the laser light L from the front face 3 side or rear face 21 side. Even when the laser light L is irradiated from the front face 3 side after the n-type layer 31 and p-type layer 32 are formed, the n-type layer 31 and p-type layer 32 can be prevented from melting, since the laser light L is transmitted through the sapphire substrate 1, n-type layer 31, and p-type layer 32.

Figure 31:
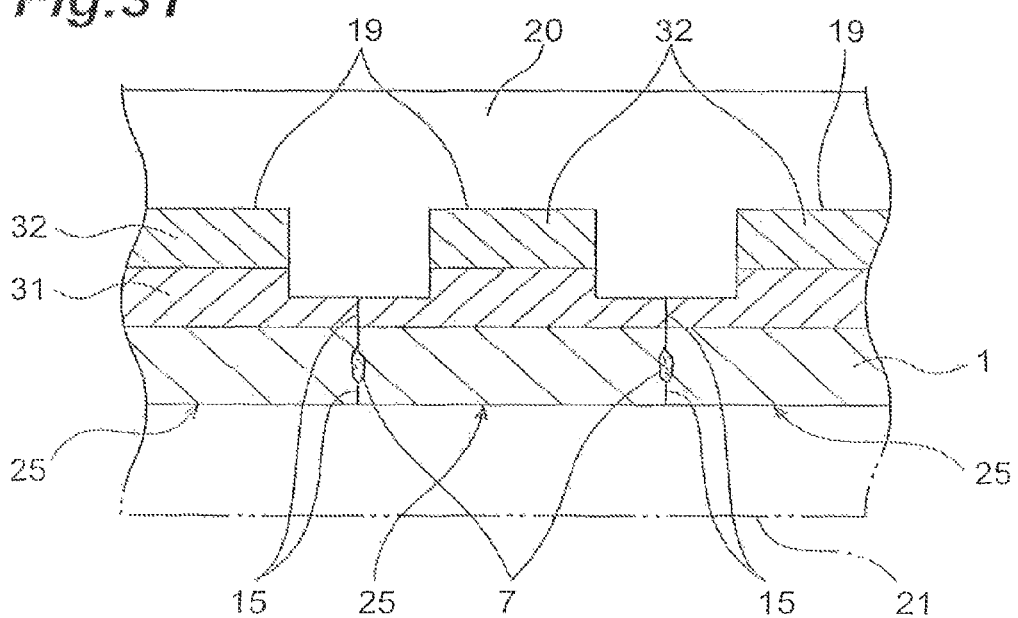
FIG. 31 is a sectional view for explaining a step of grinding the sapphire substrate in accordance with Example 2.

After the functional devices 19 made of the n-type layer 31 and p-type layer 32 are formed, a protective film 20 is attached to the front face 3 side of the sapphire substrate 1. The protective film 20 is used for protecting the functional devices 19 formed on the front face 3 of the semiconductor substrate 1 and holding the sapphire substrate 1. Subsequently, as shown in FIG. 31, the rear face 21 of the sapphire substrate 1 is subjected to surface grinding, so that the sapphire substrate 1 is thinned to the thickness of 150 μm. The grinding of the rear face 21 of the sapphire substrate 1 generates a fracture 15 from a starting point region for cutting formed by the modified region 7 as a start point. This fracture 15 reaches the front face 3 and rear face 21 of the sapphire substrate 1, whereby the sapphire substrate 1 is divided into semiconductor chips 35 each having the functional device 19 constituted by the n-type layer 31 and p-type layer 32.

Figure 32:
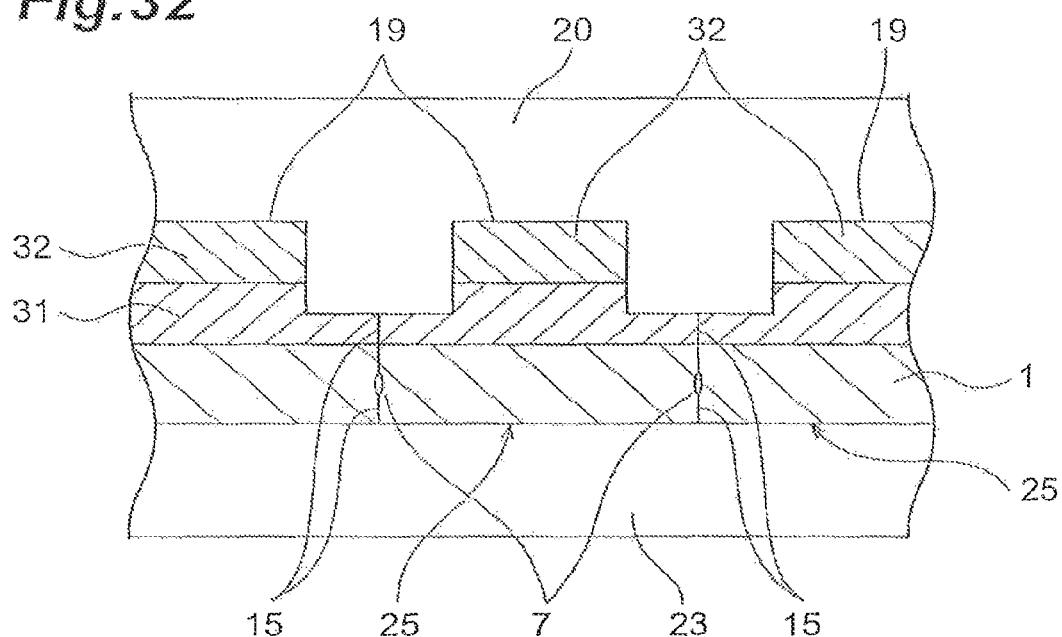
FIG. 32 is a sectional view for explaining a step of attaching an expansion film in accordance with Example 2.
Figure 33:
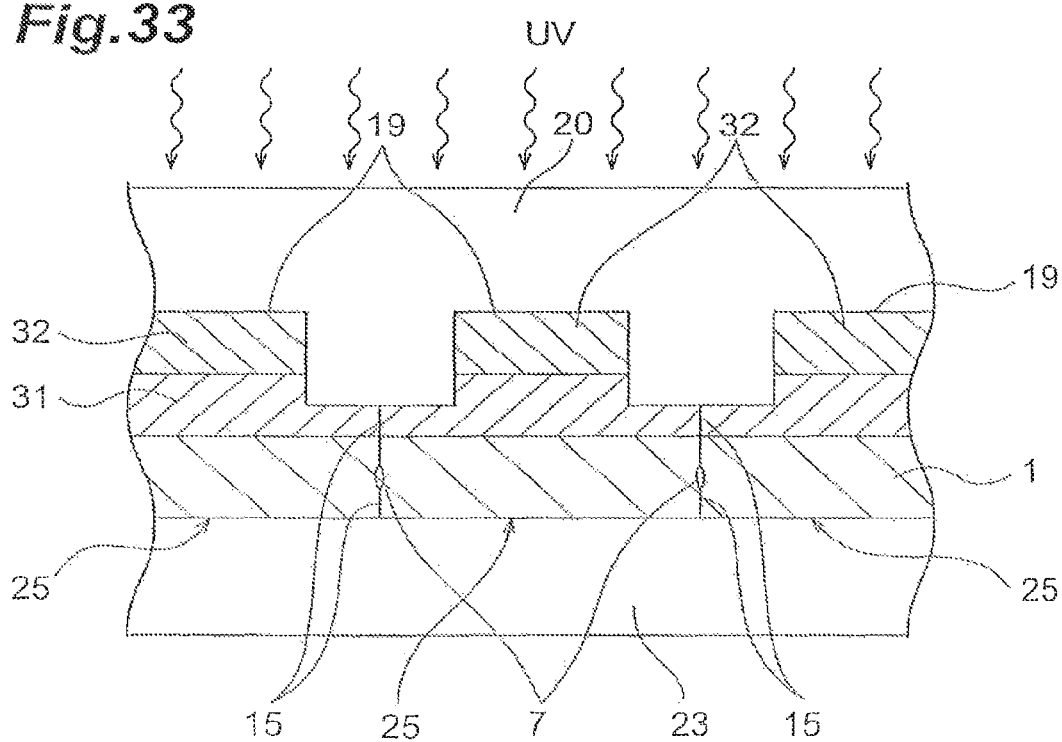
FIG. 33 is a sectional view for explaining a step of irradiating the protective film with UV rays in accordance with Example 2.
Figure 34:
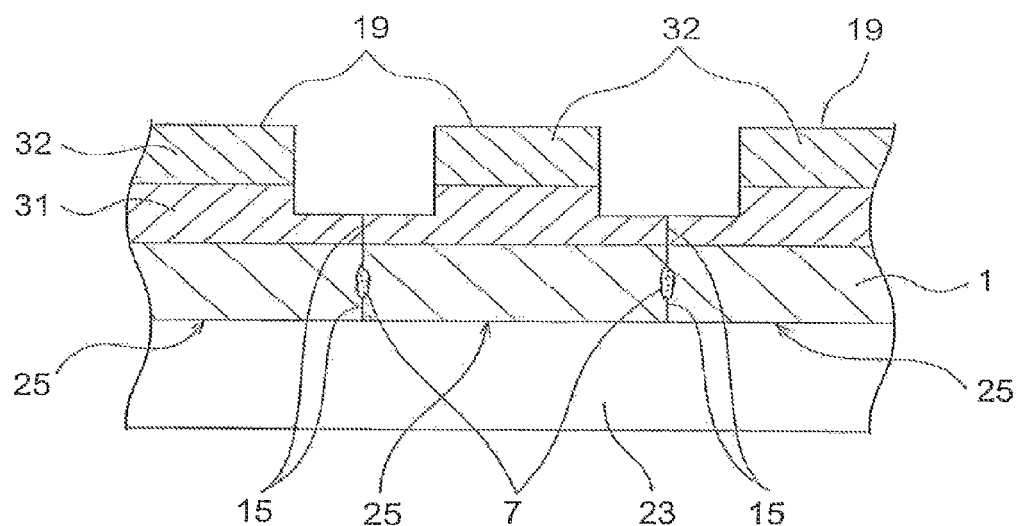
FIG. 34 is a sectional view for explaining a step of peeling the protective film in accordance with Example 2.
Figure 35:
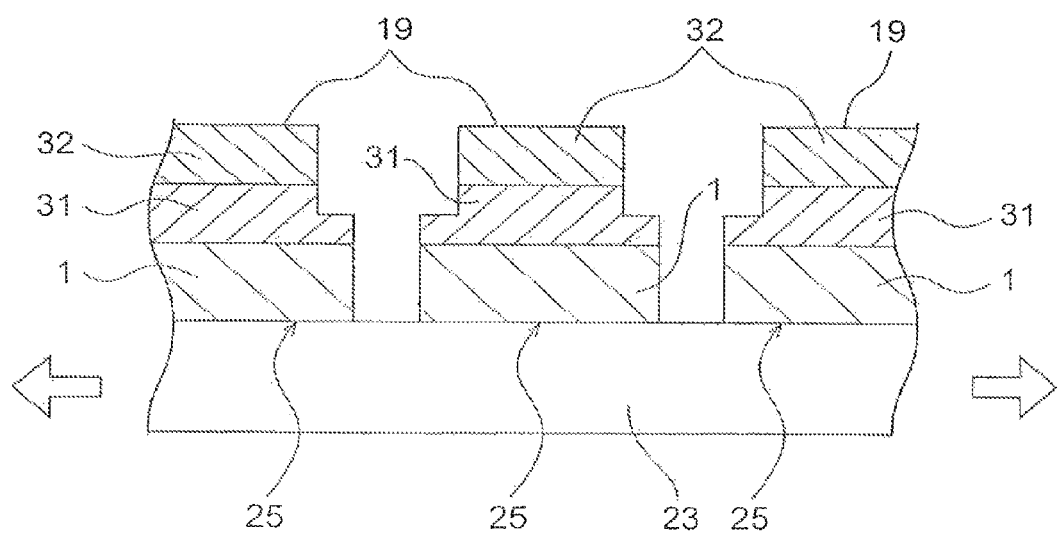
FIG. 35 is a sectional view for explaining a step of expanding the expansion film and separating semiconductor chips in accordance with Example 2.

Next, an expandable expansion film 23 is attached so as to cover the rear faces of an the semiconductor chips 25 as shown in FIG. 32, and then the protective film 20 is irradiated with UV rays as shown in FIG. 33, so as to cure a UV curable resin which is an adhesive layer of the protective film 20. Thereafter, the protective film 20 is peeled off as shown in FIG. 34. Subsequently, as shown in FIG. 35, the expansion film 23 is expanded outward, so as to separate the semiconductor chips 25 from each other, and the semiconductor chips 25 are picked up by a suction collet or the like. Thereafter, electrodes are attached to the n-type layer 31 and p-type layer 32 of the semiconductor chip 25, so as to make a light-emitting diode.

In the step of forming a starting point region for cutting in the substrate dividing method in accordance with Example 2, as explained in the foregoing, the sapphire substrate 1 is irradiated with the laser light L while the light-converging point P is positioned therewithin, so as to form a modified region 7 by generating a phenomenon of multiphoton absorption, whereby the modified region 7 can form a starting point region for cutting within the sapphire substrate 1 along a desirable line along which the substrate should be cut for cutting the sapphire substrate 1. When a starting point region for cutting is formed within the sapphire substrate 1, a fracture 15 is generated in the thickness direction of the sapphire substrate 1 from the starting point region for cutting acting as a start point naturally or with a relatively small force exerted thereon.

In the step of grinding the sapphire substrate 1, the sapphire substrate 1 is ground so as to attain a predetermined thickness after a starting point region for cutting is formed within the sapphire substrate 1. Here, even when the ground surface reaches the fracture 15 generated from the starting point region for cutting acting as a start point, the cut surfaces of the sapphire substrate 1 cut by the fracture 15 are in close contact with each other, whereby the sapphire substrate 1 can be prevented from chipping and cracking upon grinding.

Therefore, the sapphire substrate 1 can be thinned and divided while preventing the chipping and cracking from occurring, whereby semiconductor chips 25 with the thinned sapphire substrate 1 can be obtained with a favorable yield.

Effects similar to those mentioned above are also obtained when dividing a substrate using an AlN substrate or GaAs substrate instead of the sapphire substrate 1.

INDUSTRIAL APPLICABILITY

As explained in the foregoing, the present invention can thin and divide the substrate while preventing the chipping and cracking from occurring.

The invention claimed is:

1. A method of manufacturing a semiconductor device formed using a substrate dividing method, the manufacturing method comprising the steps of:
   irradiating a laser light incident face of a substrate, the substrate comprising semiconductor material and having a surface formed with at least one semiconductor device, with laser light while positioning a light-converging point within the substrate, thereby forming a molten processed region embedded within the substrate along each line of a plurality of cutting lines arranged in a grid with respect to the substrate, the substrate having a front face and a rear face through the substrate, the front face of the substrate being formed with at least one functional device, the forming of each molten processed region resulting in the forming of a starting point region for cutting the substrate, each molten processed region being located inside the substrate at a predetermined distance from the laser light incident face of the substrate; and
   grinding the rear face of the substrate after the step of forming the starting point regions, thereby eliminating the molten processed regions from the substrate, wherein the substrate comprises at least a portion of a fracture generated in a thickness direction of the substrate and extending from each starting point region after completion of the grinding step, and wherein opposing fracture surfaces resulting from the generating of at least a portion of each fracture extending from each molten processed region are in contact with each other during performance of the grinding step;
   dividing the substrate, wherein the substrate is divided when each fracture reaches the front face and the rear face of the substrate, thereby providing at least one manufactured semiconductor device.

2. A method of manufacturing a semiconductor device according to claim 1, wherein when the molten processed region is formed in the substrate by the irradiating of the laser light, and the substrate is irradiated with the laser light under a condition with a peak power density of at least $1 \times 10^8$ (W/cm$^2$) at the light converging point and a pulse width of 1 μs or less.

3. A method of manufacturing a semiconductor device according to claim 1, wherein the laser light incident face of the substrate is formed with a functional device.

4. A method of manufacturing a semiconductor device according to claim 1, wherein the step of grinding the substrate includes a step of subjecting the rear face of the substrate to chemical etching.

5. A method of manufacturing a semiconductor device according to claim 1, wherein the substrate is divided into a plurality of chips along the cutting lines.

6. A method of manufacturing a semiconductor device according to claim 1, wherein the substrate is divided when each fracture reaches the front face and the rear face of the substrate after the step of grinding.

7. A method of manufacturing a semiconductor device according to claim 1, wherein the substrate is divided when each fracture reaches the front face and the rear face of the substrate in the step of grinding the substrate.

8. A method of manufacturing a semiconductor device according to claim 1, wherein the method comprises expanding a tape attached to the rear face of the substrate after the grinding to make space between the contacting fracture surfaces and between adjacent chips formed in the substrate.

9. A method of manufacturing a semiconductor device according to claim 1, further comprising attaching a tape to the rear face of the substrate after the grinding.

10. A method of manufacturing a semiconductor device according to claim 1, wherein at the completion of the grinding, each fracture reaches the front face and the rear face of the substrate to divide the substrate.

11. A method of manufacturing a semiconductor device formed using a substrate dividing method, the manufacturing method comprising the steps of:

irradiating a laser light incident face of a substrate, the substrate comprising semiconductor material and having a surface formed with at least one semiconductor device, with laser light while positioning a light-converging point within the substrate, thereby forming a refractive index change region embedded within the substrate along each line of a plurality of cutting lines arranged in a grid with respect to the substrate, the substrate having a front face and a rear face through the substrate, the front face of the substrate being formed with at least one functional device, the forming of each refractive index change region resulting in the forming of a starting point region for cutting the substrate, each refractive index change region being located inside the substrate at a predetermined distance from the laser light incident face of the substrate, and the refractive index change region being formed by inducing an ionic valence change, crystallization, or polarization orientation within the substrate; and grinding the rear lace of the substrate after the step of forming the starting point regions, thereby eliminating the refractive index change regions from the substrate, wherein the substrate comprises at least a portion of a fracture generated in a thickness direction of the substrate and extending from each starting point region after completion of the grinding step, and wherein opposing fracture surfaces resulting from the generating of at least a portion of each fracture extending from each refractive index change region are in contact with each other during performance of the grinding step;

dividing the substrate, wherein the substrate is divided when each fracture reaches the front face and the rear face of the substrate, thereby providing at least one manufactured semiconductor device.

12. A method of manufacturing a semiconductor device according to claim 11, wherein the laser light incident face of the substrate is formed with a functional device.

13. A method of manufacturing a semiconductor device according to claim 11, wherein the step of grinding the substrate includes a step of subjecting the rear face of the substrate to chemical etching.

14. A method of manufacturing a semiconductor device accruing to claim 11, wherein when the refractive index changing region is formed in the substrate by the irradiating, the substrate is irradiated with the laser light under a condition with a peak power density of at least $1 \times 10^8$ (W/cm$^2$) at the light-converging point and a pulse width of 1 ns or less.

15. A method of manufacturing a semiconductor device according to claim 11, wherein the substrate is divided into a plurality of chips along the cutting lines.

16. A method of manufacturing a semiconductor device according to claim 11, wherein the substrate is divided when each fracture reaches the front face and the rear face of the substrate after the step of grinding.

17. A method of manufacturing a semiconductor device according to claim 11, wherein the substrate is divided when each fracture reaches the front face and the rear face of the substrate in the step of grinding the substrate.

18. A method of manufacturing a semiconductor device according to claim 11, wherein the method comprises expanding a tape attached to the rear face of the substrate after the grinding to make space between the contacting fracture surfaces and between adjacent chips formed in the substrate.

19. A method of manufacturing a semiconductor device according to claim 11, further comprising attaching a tape to the rear face of the substrate after the grinding.

20. A method of manufacturing a semiconductor device according to claim 11, wherein at the completion of the grinding, each fracture reaches the front face and the rear face of the substrate to divide the substrate.

* * * * *